(12) United States Patent
Sharon et al.

(10) Patent No.: US 10,158,380 B2
(45) Date of Patent: Dec. 18, 2018

(54) ECC AND READ ADJUSTMENT BASED ON DYNAMIC MEMORY ERROR MODEL ESTIMATION

(71) Applicant: SANDISK TECHNOLOGIES LLC, Plano, TX (US)

(72) Inventors: Eran Sharon, Rishon Lezion (IL); Alexander Bazarsky, Holon (IL); Idan Goldenberg, Ramat Hasharon (IL); Stella Achtenberg, Netanya (IL); Omer Fainzilber, Even Yehuda (IL); Ran Zamir, Ramat Gan (IL)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/371,167

(22) Filed: Dec. 6, 2016

(65) Prior Publication Data

US 2018/0159560 A1 Jun. 7, 2018

(51) Int. Cl.
| | | |
|---|---|---|
| *G11C 29/00* | (2006.01) | |
| *H03M 13/00* | (2006.01) | |
| *G06F 3/06* | (2006.01) | |
| *G06F 11/10* | (2006.01) | |
| *H03M 13/29* | (2006.01) | |

(52) U.S. Cl.
CPC ........ *H03M 13/6566* (2013.01); *G06F 3/065* (2013.01); *G06F 3/067* (2013.01); *G06F 3/0619* (2013.01); *G06F 11/1068* (2013.01); *H03M 13/2906* (2013.01)

(58) Field of Classification Search
CPC .......... H03M 13/6566; H03M 13/2906; G06F 3/0619; G06F 3/065; G06F 3/067; G06F 11/1068; G06F 11/1072; G06F 11/076; G06F 2212/403; G11C 29/52; G11C 11/5642; G11C 2211/5621; G11C 2029/0411; G11C 11/5685; G11C 29/028; G11C 29/021
See application file for complete search history.

(56) References Cited

U.S. PATENT DOCUMENTS

| | | | | |
|---|---|---|---|---|
| 5,657,332 | A | * | 8/1997 | Auclair ................. G11C 16/10 365/184 |
| 7,823,043 | B2 | | 10/2010 | Lasser |
| 7,904,793 | B2 | | 3/2011 | Mokhlesi et al. |
| 8,301,979 | B2 | | 10/2012 | Sharon et al. |

(Continued)

FOREIGN PATENT DOCUMENTS

EP 1990921 A3 5/2013

OTHER PUBLICATIONS

Sharon et al., "Generalized Syndrome Weights," U.S. Appl. No. 15/223,302, filed Jul. 29, 2016, 44 pages.

(Continued)

*Primary Examiner* — Guerrier Merant
(74) *Attorney, Agent, or Firm* — Michael Best & Friedrich LLP

(57) ABSTRACT

A device includes a memory and a controller coupled to the memory. The controller is configured to determine a first count of bits of a representation of data that are estimated to be erroneous and a second count of bits of the representation of data that have high estimated reliability and are estimated to be erroneous. The controller is further configured to modify at least one read parameter or at least one decode parameter based on the first count and the second count.

20 Claims, 15 Drawing Sheets

(56) References Cited

U.S. PATENT DOCUMENTS

| | | | |
|---|---|---|---|
| 8,418,026 | B2 | 4/2013 | D'Abreu et al. |
| 8,694,854 | B1 * | 4/2014 | Dar .................... G11C 11/5642 |
| | | | 714/752 |
| 8,797,668 | B1 * | 8/2014 | Grinchuk ........... H03M 13/1102 |
| | | | 360/46 |
| 9,128,858 | B1 | 9/2015 | Micheloni et al. |
| 9,252,817 | B2 | 2/2016 | Pan et al. |
| 2006/0075320 | A1 | 4/2006 | Gendrier et al. |
| 2009/0199073 | A1 | 8/2009 | Kanaoka et al. |
| 2010/0088575 | A1 | 4/2010 | Sharon et al. |
| 2013/0305114 | A1 | 11/2013 | Olcay et al. |
| 2015/0149840 | A1 | 5/2015 | Alhussien et al. |
| 2015/0205664 | A1 | 7/2015 | Janik et al. |
| 2015/0234706 | A1 * | 8/2015 | Alrod .................. G06F 11/1072 |
| | | | 714/704 |
| 2016/0092284 | A1 * | 3/2016 | Shur .................... G06F 11/076 |
| | | | 714/704 |
| 2016/0142074 | A1 | 5/2016 | Sham et al. |
| 2016/0191078 | A1 | 6/2016 | Gilbert |
| 2017/0300377 | A1 * | 10/2017 | Kaynak ............... G06F 11/1068 |
| 2018/0032396 | A1 | 2/2018 | Sharon et al. |

OTHER PUBLICATIONS

United States Patent Office Action for U.S. Appl. No. 15/408,823 dated May 16, 2018 (15 pages).
United States Patent Office Action for U.S. Appl. No. 15/896,440 dated Apr. 20, 2018 (5 pages).
United States Patent Office Action for U.S. Appl. No. 15/408,823 dated Oct. 2, 2018 (6 pages).

* cited by examiner

Syndrome Vector = [1, 0, 0, 1, 0]    Syndrome Weight = 2

Generalized Syndrome Weight = [0, 4, 2]

Bitwise Syndrome Vector = [2, 1, 1, 2, 1, 1]

ECC AND READ ADJUSTMENT BASED ON DYNAMIC MEMORY ERROR MODEL ESTIMATION

FIELD OF THE DISCLOSURE

The present disclosure is related to error correction code (ECC) input data.

BACKGROUND

Non-volatile data storage devices, such as embedded flash memory, have allowed for increased portability of data and software applications. Information that is read from a non-volatile data storage device is often processed by an error correction code (ECC) decoder to correct errors that may be introduced into stored data during operation of the non-volatile data storage device. One example of such an ECC decoder is a low-density parity check (LDPC) decoder.

An LDPC decoder may use soft bits (e.g., reliability information) to decode hard bits (e.g., information indicating voltages read from a memory). Utilization of reliability information (soft bits) may significantly improve the decoder's correction capability. A soft bit can indicate a reliability of a corresponding hard bit. For example, a value of a soft bit may indicate a low reliability value if a corresponding voltage read from a storage element is close to a transition region between two adjacent states. If many of the errors in stored values are concentrated in state overlap regions (e.g., regions between two adjacent states), soft bits can provide significant improvements in error correction capability.

However, the achievable correction capability of the decoder also depends on the "quality" of the reliability information. For example, if errors are not concentrated in state overlap regions, the reliability information provided by soft bits may not be accurate. Inaccurate soft bits can be generated when single-level cell (SLC) data having errors is "folded" in tri-level cells (TLCs) using a "blind" On-Chip-Copy (OCC) operation. Inaccurate soft bits may also be generated when a TLC has a long error tail, such as a long Er-to-A tail (e.g., a stretching of a threshold voltage distribution of erased cells into the "A" programming state) caused by a program disturb. In these cases, a hard bit may be in error even though the corresponding soft bit indicates a high reliability value. Such an error is referred to as a "Hard Error" (HE). Additionally, the hard bit may be correct even though the corresponding soft bit indicates a low reliability value. Such a bit is referred to as an "Unreliable Correct" (URC) bit.

In order for the ECC decoder to achieve its full correction capability potential, the ECC decoder needs to be aware of the "quality" of the reliability information. To illustrate, the ECC decoder needs to be aware of a memory error model. The memory error model may dictate an expected number of erroneous bits and correct bits per each "reliability bin" (determined by the read hard bits and soft bits). For example, the memory error model determines an expected number of errors, an expected number of HEs, an expected number of URC bits, and other errors and bit counts. Based on the memory error model, the ECC decoder may assign correct initial reliabilities to bits of read data. If the ECC decoder determines expected numbers of errors and bits based on a wrong underlying memory error model, the correction capability of the ECC decoder is degraded. To illustrate, a log likelihood ratio (LLR) table used by the LDPC decoder to decode the hard bits and the soft bits may be static and determined based on an underlying assumption about an expected number of HEs and URC bits. For example, the LLR table is often determined based on a Gaussian cell distribution (CVD) model that assumes an estimated number of HEs and URC bits and that errors are most likely to occur in particular voltage ranges (e.g., in transition overlap regions). If there is a large mismatch between the estimated number of HEs and URC bits and the actual number of HEs and URC bits, the soft bits may not improve, or may even degrade, the decoding capability of the LDPC decoder.

DETAILED DESCRIPTION

Figure 1:
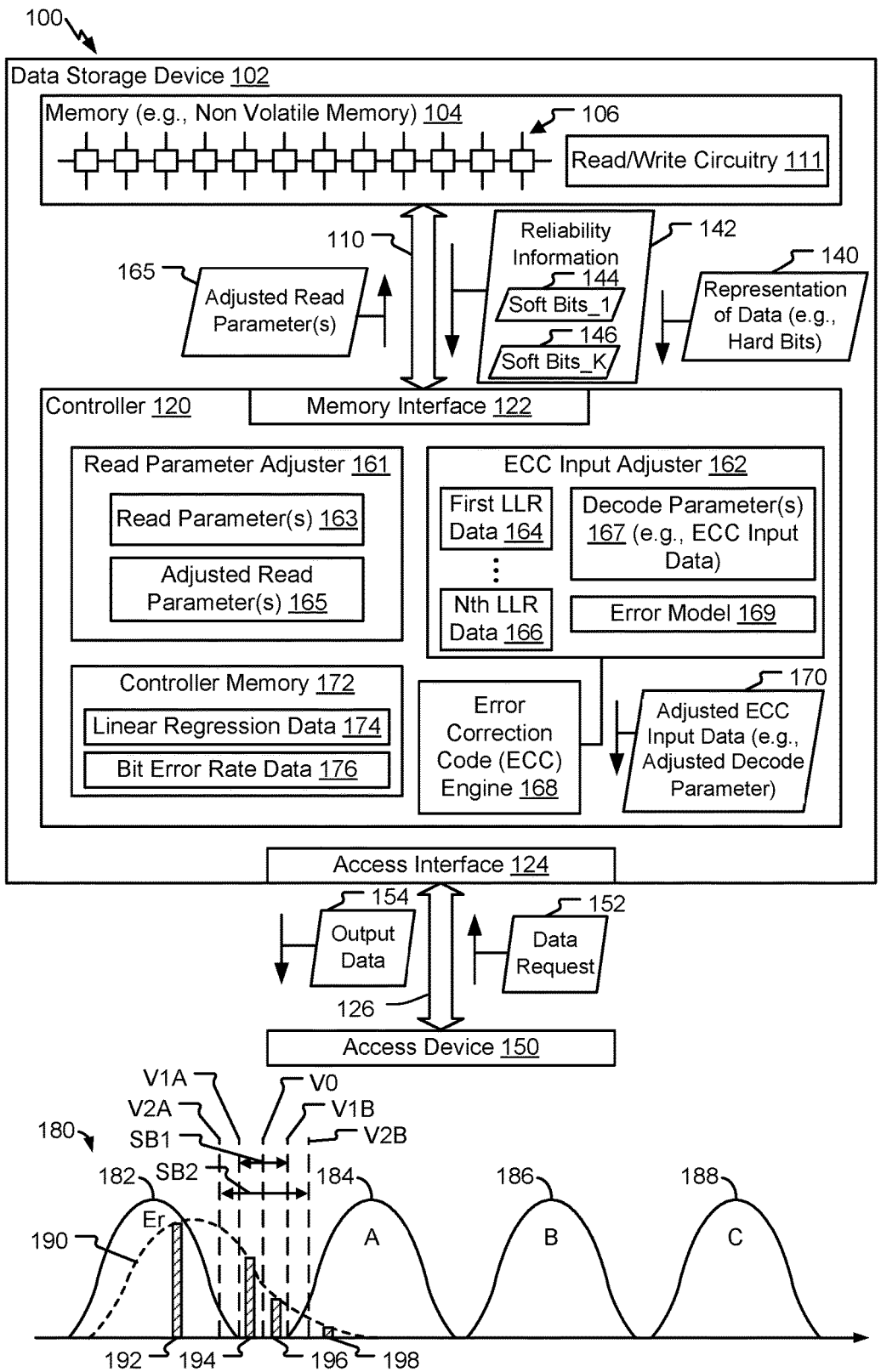
FIG. 1 is a block diagram of an illustrative example of a system including a device configured to modify a read parameter or a decode parameter based on error count(s)

Particular implementations are described with reference to the drawings. In the description, common features are designated by common reference numbers throughout the drawings. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term).

The present disclosure describes systems, devices, and methods of adjusting a decode parameter or a read parameter based on estimation of a memory error model. The memory error model is defined by a set of error counts corresponding to different "reliability bins" or "voltage bins." Each reliability bin or voltage bin may be determined by a combination of read hard bits and soft bits. The set of error counts may specify expected numbers of erroneous bits and correct bits in the different bins (e.g., the reliability bins of the voltage bins). The error counts (corresponding to the memory error model) may be estimated based on joint statistics of a syndrome metric and read hard bit pages and soft bit pages. The joint statistics may be captured through a set of syndrome based counters from which the memory error model may be estimated. Decode parameters, read parameters, or both may be "optimally" selected (e.g., selected to improve performance) based on the estimated memory error model.

The decode parameter may include log likelihood ratio (LLR) data or soft bits, and the read parameter may include a read threshold or a soft bit delta value, as non-limiting examples. To illustrate, a read threshold may be increased (or decreased) based on error counts that indicate an uneven distribution of errors. As another example, LLR data that corresponds to the error counts, instead of default LLR data, may be selected (or generated), thereby modifying a decode parameter (e.g., modifying the LLR data to be different than the default LLR data). The modified decode parameter (e.g., modified soft bits or modified LLR data) may be used to adjust error correction code (ECC) input data (or to generate ECC input data).

The error counts may be determined based on a representation of data (e.g., hard bits) and reliability information (e.g., soft bits) that are received from a memory of a data storage device. The error counts may be estimated by correlating syndrome information (e.g., a bitwise syndrome vector) and the read hard bits and soft bits. As an example, the joint statistics of the syndrome information and the read hard bits and soft bits may be captured (e.g., determined) using a set of counters that indicate how many bits have a particular read value (i.e. certain hard bits and soft bits) and are associated with a particular number of unsatisfied parity checks. Based on the counters (e.g., the syndrome counts), the memory error model (i.e. the error counts and bit counts) may be estimated. The decode parameter, the read parameter, or both may be "optimally" selected based on the estimated memory error model.

To illustrate, an ECC input adjuster or a read parameter adjuster of a controller may be configured to determine one or more error counts. For example, the ECC input adjuster or the read parameter adjuster may determine a first count of bits of the representation of data that are estimated to be erroneous, such as a "Total Error" (TE) count representative of a total number of errors in the representation of data, and a second count of bits of the representation of data that have high estimated reliability and are estimated to be erroneous, such as a "Hard Error" (HE) count representative of a number of errors in hard bits that are associated with soft bits having high reliability. In some implementations, the ECC input adjuster or the read parameter adjuster may also determine a count of bits of the representation of data that have a low estimated reliability and are estimated to be correct, such as an "Unreliable Correct" (URC) bit count representative of a number of correct hard bits that are associated with soft bits having low reliability, or counts of other bits, such as a "Reliable Correct" (RC) bit count or an "Unreliable Errors" (URE) count. The estimated error counts may be estimated based on the hard bits, the soft bits, and a syndrome metric, such as a bitwise syndrome vector. For example, the bitwise syndrome vector may be mapped to estimated error counts using a lookup table or other information. Although referred to as distinct components, in some implementations, a single component (e.g., a parameter adjuster) may perform the operations of the ECC input adjuster and the read parameter adjuster.

Additionally or alternatively, the ECC input adjuster or the read parameter adjuster may be configured to determine a syndrome metric, such as a syndrome weight or a generalized syndrome weight, based on the representation of data (e.g., the hard bits) and a count of bits of the representation of data having a particular reliability (e.g., a low reliability value) based on the reliability information (e.g., the soft bits). The estimated error counts may be determined based on the syndrome metric and the count of bits having the particular reliability. For example, the syndrome metric (e.g., the syndrome weight or the generalized syndrome weight) and the count of bits having the particular reliability may be mapped to estimated error counts using a lookup table or other information.

The ECC input adjuster may modify a decode parameter, such as soft bits or LLR data, based on the estimated counts. Modifying the decode parameter may also be referred to as adjusting (or generating) ECC input data based on the estimated error counts. For example, the ECC input adjuster may select LLR data (e.g., data indicative of an LLR table) that corresponds to the estimated error counts, and the selected LLR data may be provided to an ECC engine as adjusted ECC input data (instead of data indicative of a default or static LLR table). The ECC engine may include a low-density parity check (LDPC) encoder and an LDPC decoder. Additionally or alternatively, one or more soft bits may be adjusted based on the estimated bit counts, and the adjusted soft bits may be provided to the ECC engine as the adjusted ECC input data. Because the adjusted ECC input data (e.g., the adjusted decode parameter) accounts for an estimation of the actual number of errors (e.g., HEs and URC bits), as compared to a default model-based estimation (e.g., an estimation based on an assumed Gaussian cell voltage distribution (CVD) model), the ECC engine may decode more errors. Additionally, the ECC engine may decode the representation of data faster and using less energy than if the ECC engine decodes the representation of data using non-adjusted ECC input data (e.g., a static LLR table or unadjusted soft bits). In some implementations, the ECC input adjuster may be configured to determine an error model based on the estimated error counts, and the ECC input data (e.g., the decode parameter) may be modified based on the error model. Modifying the decode parameter based on the error model further increases the speed and decreases the power consumption of the ECC engine during decoding of the representation of data.

The read parameter adjuster may modify a read parameter, such as a read threshold or a soft bit delta value, based on the estimated counts. For example, the read parameter adjuster may select a read threshold that corresponds to the estimated error counts from multiple stored read thresholds, or the read parameter adjuster may select a soft bit delta value that corresponds to the estimated error counts from multiple stored soft bit delta values. Alternatively, the read parameter adjuster may be configured to adjust a current read threshold or soft bit delta value (e.g., by increasing or decreasing) based on the estimated error counts. The modified read parameter may be provided to the memory and used during a second read operation of the storage elements storing the data.

In a particular implementation, the ECC input adjuster or the read parameter adjuster is configured to generate a bitwise syndrome vector based on the representation of data and the reliability information (e.g., the soft bits). Each bit in the bitwise syndrome vector may indicate a number of unsatisfied parity check equations that a corresponding hard bit participates in. The bitwise syndrome vector may be computed as part of an LDPC decoder initialization process. The bitwise syndrome vector may correlate to estimated error counts according to one or more formulas, as further described herein. For example, the TE count, the HE count, the URE count, the URC bit count, and the RC bit count may be estimated based on the bitwise syndrome vector and the soft bits. The URC bit count, the URE count, and the RC bit count are optional and are not used in some implementations. The ECC input adjuster may modify a decode parameter or the read parameter adjuster may modify a read parameter based on the estimated error counts. For example, the ECC input adjuster may replace default (or static) LLR data (e.g., data indicative of a default LLR table) with LLR data that is determined based on the estimated error counts.

The LLR data may be computed or may be selected from multiple sets of LLR data (e.g., data indicative of multiple LLR tables). In a particular implementation, the ECC input adjuster selects LLR data that corresponds to the estimated error counts. To illustrate, LLR data indicative of multiple different LLR tables may be available for selection, and each LLR table may be associated with a particular value of the counts of TE, HE, and URC bits. The ECC input adjuster may select the LLR data associated with counts of TE, HE, and URC bits that match the estimated TE, HE, and URC bits. An example of such an implementation is described with reference to FIG. 3. Alternatively, the ECC input adjuster may compute the LLR data based on the error counts and the soft bits, as further described herein. Alternatively, the ECC input adjuster may compute the LLR data based on a generated error model of the representation of data, as further described herein.

In another particular implementation, the ECC input adjuster is configured to divide bits of the representation of data (e.g., the hard bits) into groups. For each group, a corresponding set of error counts is determined, and LLR data may be selected to adjust ECC input data for each group. To illustrate, the hard bits may be separated into a first group and a second group, and a first set of error counts (e.g., a first TE count, a first HE count, and a first URC bit count) may be determined based on the first group and soft bits corresponding to the first group. Additionally, a second set of error counts (e.g., a second TE count, a second HE count, and a second URC bit count) may be determined based on the second group and soft bits corresponding to the second group. Different LLR data may be selected for each group. For example, first LLR data may be selected (or computed) based on the first set of error counts, and second LLR data may be selected (or computed) based on the second set of error counts. In some implementations, the hard bits may be grouped by value (e.g., hard bits having a first value are included in a first group, hard bits having a second value are included in a second group). In other implementations, the hard bits may be grouped based on numbers of unsatisfied parity check equations. For example, a bitwise syndrome vector may be determined, and hard bits associated with a first number of unsatisfied parity check equations may be grouped into a first group. Using different LLR data for different groups of bits may enable better performance in situations where one group is associated with a larger amount of errors, such as if the channel is not symmetric (e.g., more errors occur in storing, maintaining, and reading logical "0" values than logical "1" values). An example of such an implementation is described with reference to FIG. 4.

In another particular implementation, the ECC input adjuster is configured to adjust one or more soft bits based on error counts. To illustrate, the ECC input adjuster may generate a bitwise syndrome vector based on the representation of data and the reliability information (e.g., the soft bits), as described above. Each bit in the bitwise syndrome vector may indicate a number of unsatisfied parity check equations that a corresponding hard bit participates in. Soft bits may be adjusted based on values of the bitwise syndrome vector. For example, a soft bit that has a high reliability value may be downgraded (e.g., set to a low reliability value) in response to a determination that a corresponding bit of the bitwise syndrome vector is greater than or equal to a first threshold (e.g., that a number of unsatisfied parity check equations associated with a hard bit is greater than or equal to an upper threshold). As another example, a soft bit that has a low reliability value may be upgraded (e.g., set to a high reliability value) in response to a determination that a corresponding bit of the bitwise syndrome vector is less than or equal to a second threshold (e.g., that a number of unsatisfied parity check equations associated with a hard bit is less than or equal to a lower threshold). Adjusting the soft bits based on the bitwise syndrome vector may reduce the number of HEs and URC bits, which may enable a better match with a selected (or default) LLR table. An example of such an implementation is described with reference to FIG. 5.

In another particular implementation, the ECC input adjuster or the read parameter adjuster is configured to generate a syndrome metric based on the representation of data and the reliability information (e.g., the soft bits). For example, the ECC input adjuster or the read parameter adjuster may generate a syndrome weight or a generalized syndrome weight as part of an initialization process of the LDPC decoder. In addition, the ECC input adjuster or the read parameter adjuster may determine a number of bits of the representation of data having a particular reliability. For example, the ECC input adjuster or the read parameter adjuster may determine a count of soft bits that have a particular value (or a value that is greater than or equal to a threshold). The ECC input adjuster or the read parameter adjuster may estimate the error counts based on the syndrome metric and the count of bits having the particular reliability. For example, the TE count, the HE count, the URC bit count, the URE count, the RC bit count, or a combination thereof, may be estimated based on the syndrome metric and the count of bits having the particular reliability. The ECC input adjuster may modify a decode parameter based on the estimated error counts or the read parameter adjuster may modify a read parameter based on the estimated error counts. For example, the ECC input adjuster may replace default (or static) LLR data (e.g., data indicative of a default LLR table) with LLR data that is determined based on the estimated error counts. An example of such an implementation is described with reference to FIG. 6.

A controller that modifies a decode parameter (e.g., adjusts ECC input data) based on any of the above-described techniques may improve decoding of an ECC engine. For example, selecting (or computing) LLR data that corresponds to estimated error counts results in LLR data (e.g., data indicative of an LLR table) that more accurately reflects the actual errors in the representation of the data than static LLR data (e.g., data indicative of a static LLR table). LLR data that more accurately reflects the actual errors in the representation of data improves performance of the ECC engine when decoding the representation of data. For example, the ECC engine may use the adjusted ECC input data (e.g., the determined LLR data or adjusted soft bits) to decode the representation of data faster, and with reduced power consumption, as compared to decoding the representation of data using static LLR data (or unadjusted soft bits). Improving speed and reducing power consumption of the ECC engine improves overall performance of a data storage device. Additionally, a controller that modifies a read parameter based on any of the above-described techniques may improve speed and efficiency of decoding. For example, selecting a read threshold (or a soft bit delta value) that corresponds to estimated error counts results in a read threshold that accounts for the actual voltage distribution associated with the storage elements. This read threshold (or soft bit delta value) reduces errors or provides more representative soft bits during subsequent read operations, which improves speed and reduces power consumption of the ECC engine during decoding of a representation of data.

FIG. 1 illustrates a system 100 that includes an access device 150 and a data storage device 102. The access device 150 is coupled to the data storage device 102 via a communication path 126. The communication path 126 may be a bus or a wireless connection, as non-limiting examples. The data storage device 102 may include an access interface 124 that enables communication via the communication path 126, such as when the access interface 124 is communicatively coupled to the access device 150.

The access device 150 may include a memory interface (not shown) and may be configured to communicate with the data storage device 102 via the memory interface to read data from and write data to one or more memories of the data storage device 102. For example, the access device 150 may operate in compliance with a Joint Electron Devices Engineering Council (JEDEC) industry specification, such as a Universal Flash Storage (UFS) Access Controller Interface specification. As other examples, the access device 150 may operate in compliance with one or more other specifications, such as a Secure Digital (SD) Access Controller specification, as an illustrative, non-limiting example. The access device 150 may communicate with the one or more memories in accordance with any other suitable communication protocol.

The access device 150 may include a processor and a memory. The memory may be configured to store data and/or instructions that are executable by the processor. The memory may be a single memory or may include multiple memories, such as one or more non-volatile memories, one or more volatile memories, or a combination thereof. The access device 150 may issue one or more commands to the data storage device 102, such as one or more requests to erase data, read data from, or write data to the data storage device 102. For example, the access device 150 may be configured to provide data to be stored at the data storage device 102 or to request data to be read from the data storage device 102. The access device 150 may include a mobile telephone, a music player, a video player, a gaming console, an electronic book reader, a personal digital assistant (PDA), a computer, such as a laptop computer or notebook computer, a network computer, a server, any other electronic device, or any combination thereof, as illustrative, non-limiting examples.

The data storage device 102 includes a memory 104 and a controller 120. In some implementations, the data storage device 102 may include a memory device that includes one or more memory dies (e.g., one memory die, two memory dies, eight memory dies, or another number of memory dies). The memory 104 may be a non-volatile memory that includes one or more storage elements 106. For example, the memory 104 may include a flash memory (e.g., a NAND flash memory, a NOR flash memory, etc.) or a resistive random access memory (ReRAM), as illustrative, non-limiting examples. In some implementations, the memory 104 may include or correspond to a memory die of the data storage device 102. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may store data in multiple regions that include one or more storage elements 106. The one or more storage elements 106 may be configured to store data. For example, each storage element of the one or more storage elements 106 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level cell (SLC) word line, a multi-level cell (MLC) word line, or as a tri-level cell (TLC) word line, as non-limiting examples. SLC data may be stored as a single bit per storage element, and MLC data may be stored as multiple bits per storage element.

The memory 104 may include support circuitry, such as read/write circuitry 111, to support operation of one or more memory dies of the memory 104. For example, the read/write circuitry 111 may include one or more buffers, drivers, or other circuitry used to perform read operations, write operations, or both, at the memory 104. The read/write circuitry 111 may be a single component or may be divided into separate components of the memory 104, such as read circuitry and write circuitry. The read/write circuitry 111 may be external to the one or more dies of the memory 104. Alternatively, one or more individual memory dies of the memory 104 may include corresponding read/write circuitry 111 that is operable to read data from and/or write data to storage elements within the individual memory die independent of any other read and/or write operations at any of the other memory dies. In some implementations, the read/write circuitry 111 is configured to perform read operations based on adjusted read parameters, as further described herein.

The controller 120 is coupled to the memory 104 via a bus 110, an interface (e.g., interface circuitry, such as a memory interface 122), another structure, or a combination thereof. For example, the bus 110 may include one or more channels to enable the controller 120 to communicate with a single memory die of the memory 104. As another example, the bus 110 may include multiple distinct channels to enable the controller 120 to communicate with each memory die of the memory 104 in parallel with, and independently of, communication with other memory dies of the memory 104.

The controller 120 is configured to receive data and instructions from the access device 150 and to send data to the access device 150. For example, the controller 120 may send data to the access device 150 via the access interface 124, and the controller 120 may receive data from the access device 150 via the access interface 124. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data. The controller 120 is also configured to send a read command to the memory 104 to cause read data to be sent from the memory 104 to the controller 120. The read command may specify a physical address of a portion of the memory 104 (e.g., a physical address of a word line of the memory 104). The read data may include a representation of data stored at the memory 104 and reliability information, as further described herein. The controller 120 may also be configured to send data and commands to the memory 104 associated with background scanning operations, garbage collection operations, wear leveling operations, relocation operations, etc., as illustrative, non-limiting examples.

The controller 120 includes a read parameter adjuster 161, an error correction code (ECC) input adjuster 162, an ECC engine 168, and a controller memory 172. The read parameter adjuster 161 may be configured to receive read data (e.g., a representation of data and reliability information) from the memory 104, to determine one or more error counts, and to modify a read parameter 163 based on the one or more error counts to generate an adjusted read parameter 165. The read parameter 163 may include one or more read parameters, such as a read threshold, a soft bit delta value, or other read parameters. The adjusted read parameter 165 may be provided to the memory 104 to be used (e.g., by the read/write circuitry 111) to perform a subsequent read operation at the memory 104. Operation of the read parameter adjuster 161 is further described with reference to FIG. 7.

The ECC input adjuster 162 may be configured to receive the read data from the memory 104, to determine one or more error counts, and to modify a decode parameter based on the one or more error counts. The decode parameter may include soft bits, log likelihood ratio (LLR) data, or other decode parameters. Modifying a decode parameter based on the one or more error counts may also be referred to herein as adjusting ECC input data based on the one or more error counts to generate adjusted ECC input data 170, as further described herein. The adjusted ECC input data 170 may be provided to the ECC engine 168 to improve performance of the ECC engine 168. Although the read parameter adjuster 161 and the ECC input adjuster 162 are described as separate components, in other implementations, a single component (e.g., a parameter adjuster) may perform the operations of both the read parameter adjuster 161 and the ECC input adjuster 162. In other implementations, the controller 120 may include either the read parameter adjuster 161 or the ECC input adjuster 162.

The controller memory 172 is configured to store data used by the controller 120 during operation, such as during modification of a decode parameter based on the one or more error counts. For example, the controller memory 172 may store linear regression data 174 and bit error rate data 176. The linear regression data 174 and the bit error rate data 176 may be used to determine an estimated error model based on one or more counter values determined based on the representation of data 140 and the reliability information 142, as further described herein.

The ECC engine 168 is configured to receive data to be stored at the memory 104 and to generate a codeword. For example, the ECC engine 168 may include an encoder configured to encode data using an ECC scheme, such as a Reed-Solomon encoder, a Bose-Chaudhuri-Hocquenghem (BCH) encoder, a low-density parity check (LDPC) encoder, a Turbo Code encoder, an encoder configured to encode one or more other ECC encoding schemes, or a combination thereof, as illustrative, non-limiting examples. In a particular implementation, the ECC engine 168 includes an LDPC encoder. The codeword may be sent (e.g., transmitted) from the controller 120 to the memory 104 and stored at the one or more storage elements 106.

The ECC engine 168 may also be configured to receive data, such as the adjusted ECC input data 170, and to process the received data in accordance with one or more ECC decoding schemes. For example, the ECC engine 168 may include one or more decoders, such as an LDPC decoder, configured to decode the adjusted ECC input data 170 to detect and correct, up to an error correction capability of the ECC scheme, any bit errors that may be present in the data. To illustrate, the representation of data read from the memory may include a representation of codeword, and the decoder may be configured to decode the codeword in accordance with an ECC scheme to generate decoded data (e.g., output data). The decoded data may be provided to the access device 150, for example in response to a read command from the access device 150.

The read parameter adjuster 161 and the ECC input adjuster 162 may receive a representation of data 140 and reliability information 142 from the memory 104. For example, the controller 120 may issue a read command to the memory 104, and the controller 120 may receive a representation of data 140 (e.g., hard bits) stored at an address indicated by the read command and reliability information 142 associated with the representation of data 140. The representation of data 140 may include one or more bits that are determined based on threshold voltages of the one or more storage elements 106, in a particular implementation. The one or more bits are referred to as hard bits. The reliability information 142 may include one or more soft bits. Each soft bit may correspond to a hard bit and may indicate a reliability of the corresponding hard bit. For example, a first value of a soft bit (e.g., a logical "1" value) may indicate that the corresponding hard bit has a low reliability level, and a second value of the soft bit (e.g., a logical "0" value) may indicate that the corresponding hard bit has a high reliability level. In a particular implementation, the reliability information 142 includes multiple sets of soft bits, including first soft bits 144 (Soft Bits_1) and Kth soft bits 146 (Soft Bits_K). K is a number that is greater than or equal to two. Each set of soft bits may be determined by reading the one or more storage elements 106 using different soft bit delta values. As described further herein, a soft bit delta value indicates a difference between a read threshold (e.g., a first read voltage associated with determining the hard bits) and a second read voltage associated with determining the soft bits.

Histogram 180 in FIG. 1 may correspond to threshold voltages that can be programmed at the memory 104. In the histogram 180, each abscissa indicates threshold voltages of storage elements of the memory 104, and each ordinate indicates a number of storage elements of the memory 104 having a particular threshold voltage. The storage elements may correspond to the one or more storage elements 106.

The histogram 180 includes an erase state distribution 182, an "A" state distribution 184, a "B" state distribution 186, and a "C" state distribution 188. The erase state distribution 182, the "A" state distribution 184, the "B" state distribution 186, and the "C" state distribution 188 may be associated with a particular lower page (LP) bit value and a particular upper page (UP) bit value. For example, the erase state distribution 182 may correspond to a "11" state, the "A" state distribution 184 may correspond to a "01" state, the "B" state distribution 186 may correspond to a "00" state, and the "C" state distribution 188 may correspond to a "10" state. The threshold voltages can be sensed by applying one or more read thresholds (e.g., read voltages) to storage elements of the memory 104, such as by applying a read threshold V0.

Additionally, soft bits may be sensed by applying one or more other read voltages that differ from the read threshold V0. The soft bit read voltages may be selected to correspond to state overlap regions (e.g., regions where one state distribution may overlap another state distribution). For example, the first soft bits 144 may be sensed by application of read voltages and may indicate storage elements having threshold voltages within a range SB1 between V1A and V1B, and the Kth soft bits 146 may be sensed by application of read voltages and may indicate storage elements having threshold voltages within a range SB2 between V2A and V2B, as non-limiting examples. A soft bit delta value corresponds to the difference between an upper (or lower) read voltage for soft bit values and the read threshold. For example, the soft bit delta value SBΔ1, corresponding to the range SB1, is equal to V1B−V0 (or V0−V1A). Thus, the range SB1 is defined as the range from read threshold −SBΔ1 to read threshold +SBΔ1. As another example, the soft bit delta value SBΔ2, corresponding to the range SB2, is equal to V2B−V0 (or V0−V2A).

The read parameter adjuster 161 and the ECC input adjuster 162 may be configured to determine one or more error counts based on a representation of data from the memory 104 and reliability information. The read parameter adjuster 161 and the ECC input adjuster 162 may be configured to determine a "Total Error" (TE) count representative of a total number of bits of the representation of data 140 that are estimated to be erroneous and a "Hard Error" (HE) count representative of a number of bits of the representation of data 140 that are estimated to be erroneous and are associated with soft bits having high reliability. For example, the HE count may track the number of hard bits (e.g., the representation of data 140) that are estimated to be erroneous and are associated with one or more soft bits having a particular value (or a threshold number of soft bits having the particular value) that indicates high reliability. In some implementations, the ECC input adjuster 162 also determines an "Unreliable Correct" (URC) bit count representative of a number of bits of the representation of data 140 that are estimated to be correct and are associated with soft bits having low reliability, an "Unreliable Error" (URE) count representative of a number of bits of the representation of data 140 that are estimated to be incorrect and are associated with soft bits having low reliability, and a "Reliable Correct" (RC) bit count representative of a number of bits of the representation of data 140 that are estimated to be correct and that are associated with soft bits having high reliability. As an example, the URC bit count may track the number of hard bits (e.g., in the representation of data 140) that are estimated to be correct and are associated with one or more soft bits having a particular value (or a threshold number of soft bits having the particular value) that indicates low reliability.

The histogram 180 also illustrates an erase state distribution 190 that is associated with a higher number of errors than the erase state distribution 182. For example, threshold voltage distribution of erased cells (e.g., storage elements) in the erase state distribution 190 may "stretch" into the A state distribution 184. Cells having threshold voltages located within a first region 192 of the erase state distribution 190 may store correct data and may have a high reliability level (e.g., bits stored in these cells may be represented by the RC bit count). Cells having threshold voltages located within a second region 194 of the erase state distribution 190 may be correct and may have a low reliability (e.g., bits stored in these cells may be represented in the URC bit count). Cells having threshold voltages located within a third region 196 of the erase state distribution 190 may be erroneous and may have a low reliability (e.g., bits stored in these cells may be represented in the TE count and the URE count). Cells having threshold voltages located within a fourth region 198 of the erase state distribution 190 may be erroneous and may have a high reliability (e.g., bits stored in these cells may be represented in the TE count and the HE count).

The read parameter adjuster 161 and the ECC input adjuster 162 may be configured to determine the one or more error counts based on the representation of data 140 and the reliability information 142 without decoding the representation of data 140. To illustrate, the read parameter adjuster 161 and the ECC input adjuster 162 may be configured to determine one or more syndrome metrics based on the representation of data 140 and the reliability information 142, and the one or more error counts may be determined based on the one or more syndrome metrics. The one or more syndrome metrics may be determined based on an ECC coding scheme used by the ECC engine 168, such as an LDPC coding scheme. For example, the one or more syndrome metrics may be determined based on parity checks associated with an LDPC coding scheme used to encode the representation of the data 140.

The one or more syndrome metrics may include a syndrome weight, a generalized syndrome weight, and a bitwise syndrome vector. The syndrome weight indicates a number of unsatisfied parity checks associated with the hard bits (e.g., the representation of data 140). The generalized syndrome weight is defined as a vector GSW=[W0 W1 Wdv], where Wi is equal to the number of bit nodes with i unsatisfied parity check equations, and where dv is the variable node degree of the bit nodes (e.g., the number of parity checks in which the bit nodes participate). The bitwise syndrome vector Q is defined as Q=[q1 q2 . . . qN], where qj is the number of unsatisfied parity check equations in which the jth bit participates, and where N is the number of bits of the hard bits (e.g., the representation of data 140). Determination of the one or more syndrome metrics is further described with reference to FIG. 2.

The one or more syndrome metrics, or the one or more syndrome metrics and the reliability information 142, may correlate to the one or more error counts. For example, the syndrome weight and a count of the number of soft bits having a particular value (e.g., a logical "0" value) may correlate to a TE count, a HE count, a URE count, a URC bit count, and a RC bit count. As another example, the generalized syndrome weight and the count of the number of soft bits having the particular value (e.g., the logical "0" value) may correlate to a TE count, a HE count, a URE count, a URC bit count, and a RC bit count. Data indicative of the correlation between the error counts and the combination of the syndrome metric (e.g., the syndrome weight or the generalized syndrome weight) and the number of soft bits having the particular value may be accessible to the read parameter adjuster 161 and to the ECC input adjuster 162 to enable the read parameter adjuster 161 and the ECC input adjuster 162 to determine the error counts based on the syndrome metric and the number of soft bits having the particular value. As one example, the read parameter adjuster 161 and the ECC input adjuster 162 may be configured to access a lookup table based on the syndrome metric and the number of soft bits having the particular value to determine the error counts.

Additionally or alternatively, the read parameter adjuster 161 and the ECC input adjuster 162 may compute the one or more error counts based on the syndrome metric. For example, the ECC input adjuster 162 may determine a bitwise syndrome vector based on the representation of data 140 and the reliability information 142. The TE count ($CNT_{TEi}$), the HE count ($CNT_{HEi}$), the URE count ($CNT_{UREi}$), the URC bit count ($CNT_{URCi}$), and the RC bit count ($CNT_{RCi}$) for each bit having a value $i \in (0,1)$ may be determined as follows:

$$CNT_{TEi} = \sum_{j=1}^{N} ((q_j \geq thu) \,\&(HB_j == (1 - i))) \quad \text{(Equation 1)}$$

$$CNT_{HEi} = \sum_{j=1}^{N} ((q_j \geq thu) \,\&(HB_j == (1 - i)) \,\&(SB_j == 1)) \quad \text{(Equation 2)}$$

$$CNT_{URCi} = \sum_{j=1}^{N} ((q_j \leq thl) \,\&(HB_j == i) \,\&(SB_j == 0)) \quad \text{(Equation 3)}$$

$$CNT_{UREi} = \sum_{j=1}^{N} ((q_j \geq thu) \,\&(HB_j == (1 - i)) \,\&(SB_j == 0)) \quad \text{(Equation 4)}$$

$$CNT_{RCi} = \sum_{j=1}^{N} ((q_j \leq thl) \,\&(HB_j == i) \,\&(SB_j == 1)) \quad \text{(Equation 5)}$$

In Equations 1-5, $q_j$ is the jth element of the bitwise syndrome vector, thu is an upper threshold, thl is a lower threshold, $HB_j$ is the jth hard bit, and $SB_j$ is the jth soft bit. The upper threshold and the lower threshold are between 0 and dv (e.g., the variable node degree). Bits are estimated to be correct (or erroneous) based on a comparison of a number of unsatisfied parity checks to the upper threshold and the lower threshold. To illustrate, a bit may be estimated to be erroneous when the number of unsatisfied parity check equations associated with the bit is greater than or equal to the upper threshold, and the bit may be estimated to be correct when the number of unsatisfied parity check equations associated with the bit is less than or equal to the lower threshold. In an alternate implementation, the syndrome weight may be used as a measure for the TE count.

The read parameter adjuster 161 may be configured to modify the read parameter 163 based on the one or more estimated error counts to generate the adjusted read parameter 165. As an example, the read parameter adjuster 161 may determine that a first bit value (e.g., a one value) is associated with more errors than a second bit value (e.g., a zero value), and the read parameter adjuster 161 may modify a read threshold to be closer to the voltage distribution of the state corresponding to the first value. As another example, the read parameter adjuster 161 may determine that the RC bit count or the HE count exceeds a threshold, and the read parameter adjuster 161 may increase a soft bit delta value. Alternatively, the read parameter adjuster 161 may determine that the HE count exceeds a first threshold and that the URC count fails to exceed a second threshold, and the read parameter adjuster 161 may increase a soft bit delta value in order to achieve a balance (also referred to as an "optimal balance") between the HEs and the URC values. In some implementations, the read parameter adjuster 161 may calculate a modification value to apply to the read parameter 163 to generate the adjusted read parameter 165. In other implementations, the error counts (or values derived from the error counts) may be used as indices to retrieve the adjusted read parameter 165 from a table or other data structure stored at a memory of the controller 120. The read parameter adjuster 161 may be configured to provide the adjusted read parameter 165 to the memory 104 for use in a subsequent read operation of a group of storage elements that correspond to the representation of data 140. For example, the read/write circuitry 111 may use the adjusted read parameter (e.g., a modified read threshold, a modified soft bit delta value, or both) to perform a subsequent read operation at the group of storage elements. Additional details of the read parameter adjuster 161 are described with reference to FIG. 7.

The ECC input adjuster 162 may be configured to modify a decode parameter 167 to generate an adjusted decode parameter. The decode parameter may be represented by ECC input data. Adjusting the decode parameter 167 may cause adjustment of ECC input data (e.g., generation of the adjusted ECC input data 170) based on the one or more error counts. The decode parameter 167 (represented by the ECC input data) may include soft bits (e.g., the first soft bits 144 and/or the Kth soft bits 146 of the reliability information 142) and other probability values, such as LLR values. LLR values may indicate an estimated value and a likelihood of the estimated value. For example, a sign of an LLR value may indicate a bit estimation (e.g., a positive LLR value corresponds to an estimated value of 0 and a negative LLR value corresponds to an estimated value of 1), and a magnitude of the LLR value may indicate a reliability of the estimation (e.g., a larger magnitude is associated with a higher reliability). The ECC engine 168 may be configured to decode the representation of the data 140 using LLR data that corresponds to the representation of the data 140 (e.g., using an LDPC decoder).

The ECC input adjuster 162 may be configured to adjust the ECC input data (e.g., data indicative of the decode parameter 167), such as default LLR data, based on the one or more error counts. For example, the ECC input adjuster 162 may determine LLR data that corresponds to the one or more error counts, and the determined LLR data may be provided to the ECC engine 168 instead of default LLR data. Default LLR data may include LLR data that is indicative of a default LLR table. The default LLR data is generated based on one or more underlying assumptions about the nature and amount of errors that occur in the memory 104. For example, the default LLR data may be generated based on a Gaussian cell voltage distribution (CVD) model that assumes that most errors occur in state overlap regions. However, such a model may not accurately reflect the actual errors that occur in read data that is read from the memory 104. If the actual error characteristics (e.g., based on the HE count and the URC bit count) differ from the underlying assumption (e.g., the Gaussian CVD model), performance of the ECC engine 168 may be degraded by the use of reliability information, such as soft bits or LLR data.

To improve operation of the ECC engine 168, the ECC input adjuster 162 may be configured to determine LLR data that more accurately reflects estimated errors, and the ECC input adjuster 162 may be configured to replace the default LLR data with the determined LLR data to generate the adjusted ECC input data 170. To illustrate, the ECC input adjuster 162 may store, or have access to, multiple sets of LLR data including first LLR data 164 and Nth LLR data 166. Each set of LLR data may be indicative of a corresponding LLR table. For example, the first LLR data 164 may be indicative of a first LLR table, and the Nth LLR data 166 may be indicative of an Nth LLR table. Each set of LLR data (e.g., each LLR table) may be predetermined and stored in a memory of the ECC input adjuster 162 or the controller 120. Each set of LLR data (e.g., each LLR table) is generated based on an underlying model (such as a Gaussian CVD model or other model) that is associated with a TE count, a HE count, and a URC bit count (or ranges of the TE count, the HE count, and the URC bit count). The ECC input adjuster 162 may be configured to access a set of LLR data based on the corresponding error counts. For example, each set of LLR data may be indexed by a combination of TE count, HE count, URE count, URC bit count, and RC bit count (or a subset thereof), or mappings of LLR data to combinations of TE count, HE count, URE count, URC bit count, and RC bit count (or a subset thereof) may be contained in a look-up table, as non-limiting examples.

The ECC input adjuster 162 may be configured to select a set of LLR data to be provided as the adjusted ECC input data 170 based on the TE count, the HE count, the URE count, the URC count, and the RC count (or a subset thereof) determined by the ECC input adjuster 162. For example, the ECC input adjuster 162 may determine the TE count, the HE count, the URE count, the URC bit count, and the RC bit count as described above, and the ECC input adjuster 162 may select LLR data that corresponds to error counts that match the TE count, the HE count, the URE count, the URC bit count, and the RC bit count (or a subset thereof). For example, the ECC input adjuster 162 may select the first LLR data 164 in response to determining that the TE count, the HE count, the URE count, the URC bit count, and the RC bit count (or a subset thereof) match (or most closely match, or are within the ranges of) error counts associated with the first LLR data 164 (e.g., error counts associated with the underlying model used to generate the first LLR data 164).

The first LLR data 164 may be provided to the ECC engine 168 as the adjusted ECC input data 170. For example, data indicative of the first LLR table may be provided to the ECC engine 168 instead of data indicative of a default LLR table. Because the adjusted ECC input data 170 is indicative of LLR values (e.g., decode parameters) that are modified as compared to default LLR values (e.g., default decode parameters), the adjusted ECC input data 170 is indicative of one or more modified decode parameters. The ECC engine 168 may be configured to use the adjusted ECC input data 170 (e.g., the first LLR data 164), the representation of data 140, and the reliability information 142 to generate LLR values used to decode the representation of data 140. Because the underlying model associated with the first LLR data 164 more accurately represents the estimated errors in the representation of data 140, providing the first LLR data 164 to the ECC engine 168 may improve performance of the ECC engine 168 (e.g., increase speed and/or reduce power consumption) as compared to providing default LLR data based on an underlying model that less accurately reflects the estimated errors in the representation of data 140.

Additionally or alternatively, the ECC input adjuster 162 may be configured to compute the LLR data based on the TE count, the HE count, and the URC count. For example, ECC input adjuster 162 may compute the LLR data according to the following:

$$LLR_j = \begin{cases} \log\dfrac{N - CNT_{URC} - CNT_{TE}}{CNT_{HE}} & \text{if } HB_j = 0 \ \& \ SB_j = 1 \\ \log\dfrac{CNT_{URC}}{CNT_{TE} - CNT_{HE}} & \text{if } HB_j = 0 \ \& \ SB_j = 0 \\ -\log\dfrac{N - CNT_{URC} - CNT_{TE}}{CNT_{HE}} & \text{if } HB_j = 1 \ \& \ SB_j = 0 \\ -\log\dfrac{CNT_{URC}}{CNT_{TE} - CNT_{HE}} & \text{if } HB_j = 1 \ \& \ SB_j = 1 \end{cases} \quad \text{(Equation 6)}$$

In Equation 6, $LLR_j$ is the jth adjusted LLR value, $HB_j$ is the jth hard bit, $SB_j$ is the jth soft bit, and N is the total number of bits (e.g., in the representation of data 140). In another particular implementation, the TE count, HE count and URC count that appear in Equation 6 may be replaced by a TE estimate, a HE estimate, and a URC estimate based on the error counts and bit counts (e.g., using a predefined lookup table that maps the TE estimate, the HE estimate, and the URC estimate to the TE count, the HE count, and the URC count, respectively). In another particular implementation, adjusting the ECC input data may include applying a clipping operation to static LLR data (e.g., default LLR data) in response to a determination that the HE count, the URC bit count, or both are greater than or equal to one or more thresholds. In other implementations, the LLR data may be determined based on the TE count, the HE count, the URE count, the URC bit count, and the RC bit count.

Although described above as generating error counts, adjusting decode parameters, and adjusting ECC input data corresponding to an entirety of the representation of data 140, in other implementations, the ECC input adjuster 162 may be configured to divide the representation of data 140 into group of bits and to generate error counts and to adjust the decode parameters (e.g., to adjust ECC input data) corresponding to groups of bits independently of other groups of bits. Adjusting ECC input data corresponding to groups of bits is further described with reference to FIG. 4.

Additionally or alternatively, the decode parameter may include one or more soft bits, and the ECC input adjuster 162 may be configured to adjust soft bits (e.g., of the reliability information 142) based on the bitwise syndrome vector. For example, a soft bit having a high reliability level may be adjusted to have a low reliability level in response to a determination that a corresponding bit of the bitwise syndrome vector is greater than or equal to an upper threshold. As another example, a soft bit having a low reliability level may be adjusted to have a high reliability level in response to a determination that a corresponding bit of the bitwise syndrome vector is less than or equal to a lower threshold. Adjusting soft bits based on the bitwise syndrome vector is further described with reference to FIG. 5.

Although the ECC input data is described above as being adjusted based on the TE count, the HE count, and the URC bit count, in other implementations, the ECC input data is adjusted based on the TE count and the HE count, and a URC bit count is not used. Alternatively, the ECC input data may be adjusted based on the TE count, the HE count, the URE count, the URC bit count, and the RC bit count. In some implementations, the ECC input data is adjusted based on an estimated error model, as further described herein.

In a particular implementation, the controller 120 (e.g., the ECC input adjuster 162) is configured to determine the TE count (e.g., a first count of bits of the representation of data 140 that are estimated to be erroneous) and the HE count (e.g., a second count of bits of the representation of data 140 that have high estimated reliability and are estimated to be erroneous). The controller 120 (e.g., the ECC input adjuster 162) is further configured to adjust ECC input data (e.g., to generate the adjusted ECC input data 170) based on the first count and the second count. The controller 120 may be configured to receive, from the memory 104, the representation of data 140 and the reliability information 142 associated with the representation of data 140, and the TE count (e.g., the first count) and the HE count (e.g., the second count) are determined based on the representation of data 140 and the reliability information 142. The controller 120 (e.g., the ECC input adjuster 162) may be further configured to determine the URC bit count (e.g., a third count of bits of the representation of data 140 that have a low estimated reliability and are estimated to be correct) and to adjust the ECC input data further based on the URC bit count (e.g., the third count). The controller 120 (e.g., the ECC input adjuster 162) may be configured to determine, based on the representation of data 140 and the reliability information 142, a bitwise syndrome vector associated with the representation of data 140, and the TE count (e.g., the first count), the HE count (e.g., the second count), and the URC bit count (e.g., the third count) may be based on the bitwise syndrome vector and the reliability information 142.

In another particular implementation, the controller 120 (e.g., the ECC input adjuster 162) may be configured to determine LLR data based on the TE count (e.g., the first count) and the HE count (e.g., the second count), and the ECC input data may include the LLR data. For example, the controller 120 (e.g., the ECC input adjuster 162) may be configured to select the LLR data from a plurality of sets of LLR data (e.g., including the first LLR data 164 and the Nth LLR data 166) based on the TE count (e.g., the first count) and the HE count (e.g., the second count). As another example, the controller 120 (e.g., the ECC input adjuster 162) may be configured to compute the LLR data based on the TE count (e.g., the first count) and the HE count (e.g., the second count), as described above.

In another particular implementation, the controller 120 (e.g., the ECC input adjuster 162) is configured to modify the ECC input data by modifying one or more of the soft bit values included in the reliability information based on the TE count (e.g., the first count) and the HE count (e.g., the second count). The controller 120 (e.g., the ECC input adjuster 162) may be configured to determine a bitwise syndrome vector based on the representation of data and the reliability information, and the ECC input adjuster 162 may be further configured to modify a first soft bit value of the soft bit values in response to determining that a corresponding bit of the bitwise syndrome vector is greater than or equal to the upper threshold (e.g., a first threshold). The controller 120 (e.g., the ECC input adjuster 162) may be configured to modify a second soft bit value of the soft bit values in response to determining that a corresponding bit of the bitwise syndrome vector is less than or equal to the lower threshold (e.g., a second threshold).

In another particular implementation, the controller 120 (e.g., the ECC input adjuster 162) is configured to determine a syndrome metric based on the representation of data 140 and the reliability information 142 and to determine a count of bits of the representation of data 140 having a particular reliability based on the reliability information 142. For example, the ECC input adjuster may determine a count of soft bits having a particular value (e.g., a logical "0" value) that is associated with high reliability. The syndrome metric may include a syndrome weight or a generalized syndrome weight. The controller 120 (e.g., the ECC input adjuster 162) may be configured to adjust ECC input data based on the syndrome metric and the count, as further described with reference to FIG. 6. The controller 120 (e.g., the ECC input adjuster 162) may also be configured to adjust the ECC input data by selecting LLR data (such as the first LLR data 164 or the Nth LLR data 166) based on the syndrome metric and the count. The selected LLR data may be provided to the ECC engine 168 as the adjusted ECC input data 170.

In another particular implementation, the controller 120 (e.g., the read parameter adjuster 161 or the ECC input adjuster 162) is configured to determine the TE count (e.g., a first count of bits of the representation of data 140 that are estimated to be erroneous) and the HE count (e.g., a second count of bits of the representation of data 140 that have high estimated reliability and are estimated to be erroneous). The controller 120 is further configured to modify at least one read parameter (e.g., the read parameter 163) or at least one decode parameter (e.g., the decode parameter 167) based on the first count and the second count. The at least one decode parameter may include one or more LLR values, one or more soft bit values, or a combination thereof. The controller (e.g., the ECC input adjuster 162) may be configured to select the one or more LLR values from a plurality of sets of LLR values (e.g., the first LLR data 164 and the Nth LLR data 166) based on the first count and the second count. The at least one read parameter may include one or more read thresholds, one or more soft bit delta values (e.g., one or more voltage thresholds used to generate reliability information corresponding to the representation of the data), or a combination thereof.

In a particular implementation, the controller 120 (e.g., the read parameter adjuster 161 or the ECC input adjuster 162) is further configured to determine a third count of bits (the URC bit count) of the representation of data 140 that have a low estimated reliability and are estimated to be correct, a fourth count of bits (the URE count) of the representation of data 140 that have a low estimated reliability and are estimated to be incorrect, and a fifth count of bits (the RC bit count) of the representation of data 140 that have a high estimated reliability and are estimated to be correct. The controller 120 is further configured to modify the at least one read parameter or the at least one decode parameter further based on the third count, the fourth count, and the fifth count. In a particular implementation, the controller 120 (e.g., the read parameter adjuster 161 or the ECC input adjuster 162) is further configured to determine, based on the representation of data 140 and reliability information 142 associated with the representation of data 140, a bitwise syndrome vector associated with the representation of data 140. The first count, the second count, and the third count are based on the bitwise syndrome vector and the reliability information 142.

In another particular implementation, the controller 120 (e.g., the ECC input adjuster 162) controller is further configured to estimate an error model 169 based at least in part on one or more count values of bits of the representation of data 140. Each count value may indicate a count of bits having a corresponding combination of bit value and number of unsatisfied parity checks, as further described herein. The at least one decode parameter is modified based on the error model 169, and the controller 120 is further configured to estimate the error model 169 based on data corresponding to a linear regression model (e.g., the linear regression data 174) or data corresponding to one or more bit error rates (e.g., the bit error rate data 176). Estimation of the error model 169 is further described herein.

During operation, the access device 150 may issue a data request 152 to the data storage device 102. The data request 152 may specify an address at the memory 104, such as a logical address of the one or more storage elements 106. The controller 120 may receive the data request 152 and may issue a read command to the memory 104. The read command may specify a physical address that corresponds to the logical address of the data request 152. In response to issuing the read command, the controller 120 may receive the representation of data 140 and the reliability information 142 from the memory 104.

The read parameter adjuster 161 may determine one or more error counts (e.g., the TE count, the HE count, the URE count, the URC bit count, the RC bit count, or a combination thereof). The read parameter adjuster 161 may modify the read parameter 163 based on the one or more error counts to generate the adjusted read parameter 165. For example, the read parameter adjuster 161 may increase (or decrease) a read threshold or a soft bit delta value based on the one or more error counts. As another example, the read parameter adjuster 161 may retrieve a value of the adjusted read parameter 165 from a table or other data structure (e.g., stored at the controller memory 172) based on the one or more error counts (e.g., using the one or more error counts as indices). Additional details of generating the adjusted read parameter 165 are described with reference to FIG. 7. The adjusted read parameter 165 may be provided to the memory 104 for use in performing subsequent read operations. For example, the read write circuitry 111 may perform a subsequent read operation at storage elements corresponding to the representation of data 140 using the adjusted read parameter 165.

The ECC input adjuster 162 may determine one or more error counts (e.g., the TE count, the HE count, and optionally, the URE count, the URC bit count, the RC bit count, or a combination thereof). In a particular implementation, the ECC input adjuster 162 determines a bitwise syndrome vector associated with the representation of data 140, and the ECC input adjuster 162 determines the one or more error counts based on the bitwise syndrome vector, as further described with reference to FIG. 3. In another particular implementation, the ECC input adjuster 162 divides the representation of data 140 into groups of bits and determines error counts for each group of bits, as further described with reference to FIG. 4. In another particular implementation, the ECC input adjuster 162 determines a syndrome weight (or a generalized syndrome weight) and a count of bits of the representation of data 140 having a particular reliability, as further described with reference to FIG. 6.

The ECC input adjuster 162 may adjust ECC input data based on the one or more error counts. For example, the ECC input adjuster 162 may determine LLR data based on the one or more error counts, and the ECC input adjuster 162 may replace default LLR data with the determined LLR data to generate the adjusted ECC input data 170. To illustrate, the ECC input adjuster 162 may determine that the one or more error counts match (or most closely match) error counts corresponding to the first LLR data 164, and the ECC input adjuster 162 may select the first LLR data 164 based on the determination. Additionally or alternatively, the ECC input adjuster 162 may compute LLR data based on the one or more error counts, in accordance with Equation 6. Additionally or alternatively, the ECC input adjuster 162 may adjust one or more soft bits (e.g., the first soft bits 144 and/or the Kth soft bits 146) based on the one or more error counts, as further described with reference to FIG. 5. Additionally or alternatively, the ECC input adjuster 162 may select LLR data based on the syndrome weight (or the generalized syndrome weight) and the count of bits having a particular reliability, as further described with reference to FIG. 6.

The ECC engine 168 may receive the adjusted ECC input data 170 and may decode the representation of data 140 based on the adjusted ECC input data 170. For example, the ECC engine 168 may decode the representation of data 140 using the adjusted ECC input data 170 in accordance with an LDPC scheme. As part of a decoding process, the ECC engine 168 may generate one or more LLR values based on the adjusted ECC input data 170, the representation of data 140, and the reliability information 142. The decoded data may be provided to the access device 150 as output data 154.

The read parameter adjuster 161 and the ECC input adjuster 162 may improve decoding performed by the ECC engine 168. For example, the ECC input adjuster 162 may select (or compute) LLR data that more accurately reflects the actual errors in the representation of the data 140 than static LLR data (e.g., data indicative of a static LLR table). LLR data that more accurately reflects the actual errors in the representation of data 140 improves performance of the ECC engine 168 when decoding the representation of data 140. For example, the ECC engine 168 may use the adjusted ECC input data 170 (e.g., the modified decode parameter, such as the determined LLR data or adjusted soft bits) to decode the representation of data 140 faster, and with reduced power consumption, as compared to decoding the representation of data 140 using static LLR data (or unadjusted soft bits). Additionally, using the adjusted read parameter 165 to perform subsequent read operations to a group of storage cells may reduce errors or increase reliability of received read data, which increases the speed and reduces the power consumption of the ECC engine 168. Improving speed and reducing power consumption of the ECC engine 168 improves overall performance of the data storage device 102.

Figure 2:
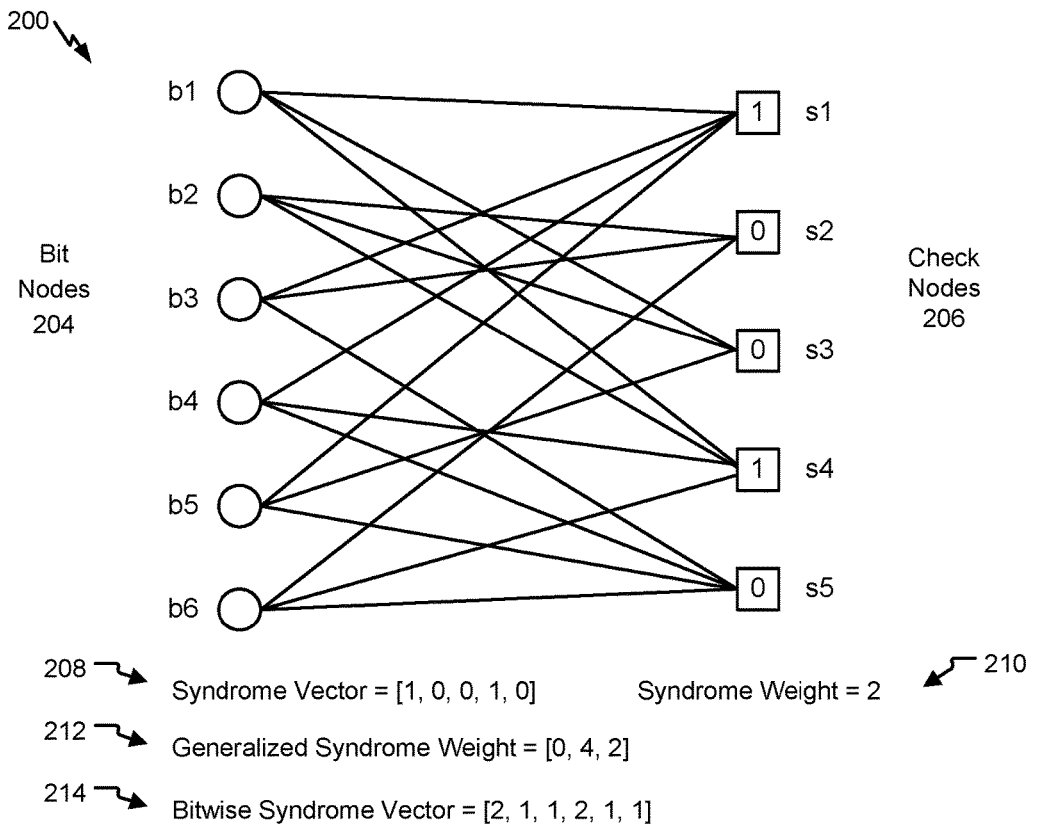
FIG. 2 illustrates an illustrative example of syndrome metrics and error counts used to modify read parameters or decode parameters.
Figure 2:
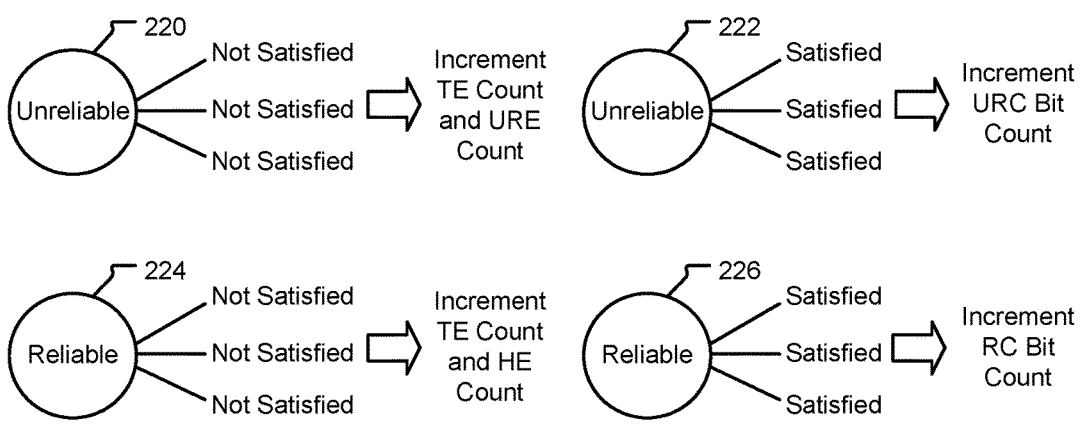

Referring to FIG. 2, an example of syndrome metrics and error counts used to modify a decode parameter (e.g., to adjust ECC input data) or to modify a read parameter is shown. FIG. 2 depicts a simplified example of a sparse bipartite graph 200 which corresponds to an illustrative LDPC code used by the ECC engine 168. The sparse bipartite graph 200 includes a plurality of bit nodes 204 and a plurality of check nodes 206. In a particular implementation illustrated in FIG. 2, the plurality of bit nodes 204 includes six bit nodes and the plurality of check nodes 206 includes five check nodes. In other implementations, the sparse bipartite graph 200 includes fewer than six or more than six bit nodes and fewer than five or more than five check nodes. Each bit node may correspond to a bit of the representation of data 140, and each check node is associated with a parity check in which one or more of the bits participates. To illustrate, each bit node of the plurality of bit nodes 204 is connected to multiple check nodes of the plurality of check nodes 206, and each bit participates in parity checks corresponding to the connected parity check nodes. A variable node degree (dv) corresponds to the number of parity checks in which a bit participates. In the example of FIG. 2, each bit node has a variable node degree of three. A check node degree (dc) corresponds to the number of bits which participate in a parity check. As an example, the check node s5 in FIG. 2 has a check node degree of four.

When a codeword is generated, each bit of the codeword satisfies all connected parity checks. After a codeword is stored in a memory, such as the memory 104 of FIG. 1 (e.g., a non-volatile memory), and read from the memory, errors may be introduced into the representation of the codeword. The errors cause one or more parity checks to be unsatisfied. For example, as illustrated in FIG. 2, when a representation of data is read from memory (e.g., the representation of data 140 of FIG. 1), check nodes s2, s3, and s5 may be satisfied (as indicated by a check node value of 0), and check nodes s1 and s4 may be unsatisfied (as indicated by a check node value of 1). One or more syndrome metrics may be associated with the representation of data.

As one example, a syndrome vector 208 may be associated with the representation of data. Each element of the syndrome vector 208 indicates whether a parity check of a corresponding check node is satisfied (e.g., has a logical "0" value) or unsatisfied (e.g., has a logical "1" value). In FIG. 2, the syndrome vector 208 is [1, 0, 0, 1, 0]. A syndrome weight 210 may be associated with the representation of data. The syndrome weight 210 indicates a number of check nodes having unsatisfied parity checks. The syndrome weight 210 may be determined by summing the elements of the syndrome vector. In FIG. 2, the syndrome weight 210 is two (e.g., because two check nodes, s1 and s4, are associated with unsatisfied parity checks).

The representation of data may be associated with a generalized syndrome weight 212. The generalized syndrome weight 212 may be defined as a vector GSW=[W0, W1, ..., Wdv], where Wi is equal to the number of bit nodes with i unsatisfied parity checks, and where dv is the variable node degree of the bit nodes. In FIG. 2, the generalized syndrome weight 212 is [0, 4, 2]. For example, the second element (e.g., W1) of the generalized syndrome weight 212 is four because four bit nodes (e.g., bit nodes b2, b3, b5, and b6) participate in one unsatisfied parity check. The representation of data may also be associated with a bitwise syndrome vector 214. The bitwise syndrome vector 214 is defined as a vector Q=[q1, q2, ..., qN], where qj is the number of unsatisfied parity checks in which the jth bit participates, and where N is the number of hard bits (e.g., the number of bit nodes). In FIG. 2, the bitwise syndrome vector 214 is [2, 1, 1, 2, 1, 1]. For example, the fourth element of the bitwise syndrome vector 214 is two because the fourth bit b4 participates in two unsatisfied parity checks (e.g., parity checks associated with check node s1 and check node s4).

Additionally, as described with reference to FIG. 1, one or more error counts (e.g., the TE count, the HE count, the URE count, the URC bit count, and the RC bit count) may be determined based on syndrome metrics and soft bits. FIG. 2 illustrates four illustrative bits 220-226, that cause at least one error count or bit count to be incremented. To illustrate, a TE count and a URE count may be incremented in response to a determination that a bit 220 has a low reliability (e.g., a determination that the bit 220 corresponds to a soft bit having a logical "1" value) and that the bit 220 is associated with a number of unsatisfied parity checks that is greater than or equal to an upper threshold. In a particular implementation, the upper threshold is three. In other implementations, the upper threshold may be less than three or more than three. The number of unsatisfied parity checks may be indicated by a corresponding element of the bitwise syndrome vector 214. A URC bit counter may be incremented in response to a determination that a bit 222 has a low reliability and that the bit 222 is associated with a number of unsatisfied parity checks that is less than or equal to a lower threshold. In a particular implementation, the lower threshold is zero. In other implementations, the lower threshold may be more than zero. The TE count and a HE count may be incremented in response to a determination that a bit 224 has a high reliability (e.g., a determination that the bit 224 corresponds to a soft bit having a logical "0" value) and that the bit 224 is associated with a number of unsatisfied parity checks that is greater than or equal to the upper threshold. The RC bit count may be incremented in response to a determination that a bit 226 has a high reliability (e.g., a determination that the bit 226 corresponds to a soft bit having a logical "0" value) and that the bit 226 is associated with a number of unsatisfied parity checks that is less than or equal to the lower threshold. As described with reference to FIG. 1, the one or more error counts (e.g., the TE count, the HE count, the URE count, the URC bit count, and the RC bit count) may be used to modify a decode parameter or modify a read parameter.

Figure 3:
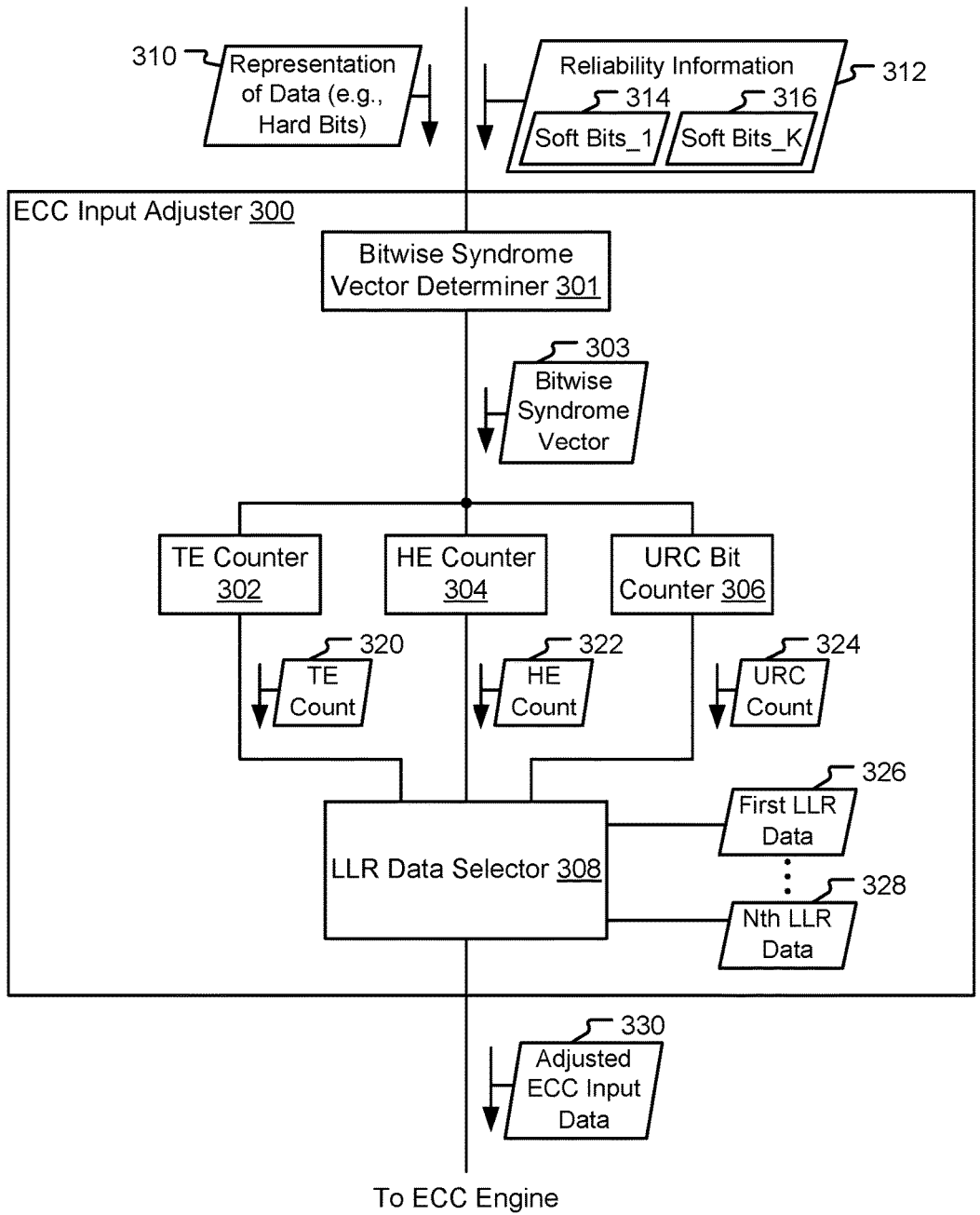
FIG. 3 is a block diagram of a first illustrative example of an ECC input adjuster.

Referring to FIG. 3, a first illustrative example of an ECC input adjuster is shown and generally designated 300. The ECC input adjuster 300 may include or correspond to the ECC input adjuster 162 of FIG. 1. The ECC input adjuster 300 includes a bitwise syndrome vector determiner 301, a TE counter 302, a HE counter 304, a URC bit counter 306, and a LLR data selector 308. In other implementations, the ECC input adjuster 300 may include a URE counter and a RC bit counter.

The bitwise syndrome vector determiner 301 may be configured to generate a bitwise syndrome vector 303 based on a representation of data 310 and reliability information 312. The representation of data 310 may include one or more hard bits, and the reliability information 312 may include soft bits, such as first soft bits 314 (Soft Bits_1) and Kth soft bits 316 (Soft Bits_K). The representation of data 310 may include or correspond to the representation of data 140 of FIG. 1, and the reliability information 312 may include or correspond to the reliability information 142 of FIG. 1. The bitwise syndrome vector determiner 301 may be configured to generate the bitwise syndrome vector 303 by determining the number of unsatisfied parity checks that each bit of the representation of data 310 participates in, as described with reference to FIGS. 1-2.

The TE counter 302 may be configured to determine a TE count 320 based on the bitwise syndrome vector 303. For example, the TE counter 302 may be configured to determine the number of elements of the bitwise syndrome vector 303 that that are greater than or equal to an upper threshold. The HE counter 304 may be configured to determine a HE count 322 based on the bitwise syndrome vector 303 and the reliability information 312. For example, the HE counter 304 may be configured to determine the number of elements of the bitwise syndrome vector 303 that are greater than or equal to the upper threshold and that correspond to a soft bit having a high reliability (e.g., a soft bit that has a logical "0" value). The URC bit counter 306 may be configured to determine a URC bit count 324 based on the bitwise syndrome vector 303 and the reliability information 312. For example, the URC bit counter 306 may be configured to determine the number of elements of the bitwise syndrome vector 303 that are less than or equal to a lower threshold and that correspond to a soft bit having a low reliability (e.g., a soft bit that has a logical "1" value).

The LLR data selector 308 may be configured to select LLR data based on the TE count 320, the HE count 322, and the URC bit count 324. To illustrate, the LLR data selector 308 may be configured to access a plurality of sets of LLR data, including first LLR data 326 and Nth LLR data 328. Each set of LLR data may indicate an LLR table, and each set of LLR data may correspond to a TE count value, a HE count value, and a URC bit count value. The LLR data selector 308 may be configured to select LLR data having the TE count value, the HE count value, and the URC bit count value that match (or most closely match) the TE count 320, the HE count 322, and the URC bit count 324. For example, the LLR data selector 308 may select the first LLR data 326 based on a determination that the TE count value, the HE count value, and the URC bit count value associated with the first LLR data 326 match (or most closely match) the TE count 320, the HE count 322, and the URC bit count 324, respectively.

The selected LLR data may be provided as adjusted ECC input data 330 to an ECC engine, such as the ECC engine 168 of FIG. 1. For example, the LLR data selector 308 may be configured to adjust ECC input data by replacing default LLR data with the selected LLR data. Replacing the default LLR data with selected LLR data modifies a decode parameter (e.g., the default LLR data) to generate a modified decode parameter (e.g., the selected LLR data). Although the LLR data selector 308 is described as selecting the LLR data based on the TE count 320, the HE count 322, and the URC bit count 324, in other implementations, the URC bit counter 306 is not included in the ECC input adjuster 300 and the LLR data selector 308 selects the LLR data based on the TE count 320 and the HE count 322. In other implementations, the LLR data selector 308 may be replaced with a LLR data generator that is configured to compute LLR data based on the TE count 320, the HE count 322, and the URC bit count 324, as described with reference to FIG. 1.

The ECC input adjuster 300 may improve decoding performed by an ECC engine. For example, the ECC input adjuster 300 may select LLR data that more accurately reflects the actual errors in a representation of the data than static LLR data (e.g., data indicative of a static or default LLR table). LLR data that more accurately reflects the actual errors in the representation of data improves performance of the ECC engine when decoding the representation of data. For example, the ECC engine may use the adjusted ECC input data 330 (e.g., the selected LLR data) to decode the representation of data faster, and with reduced power consumption, as compared to decoding the representation of data using static LLR data.

Figure 4:
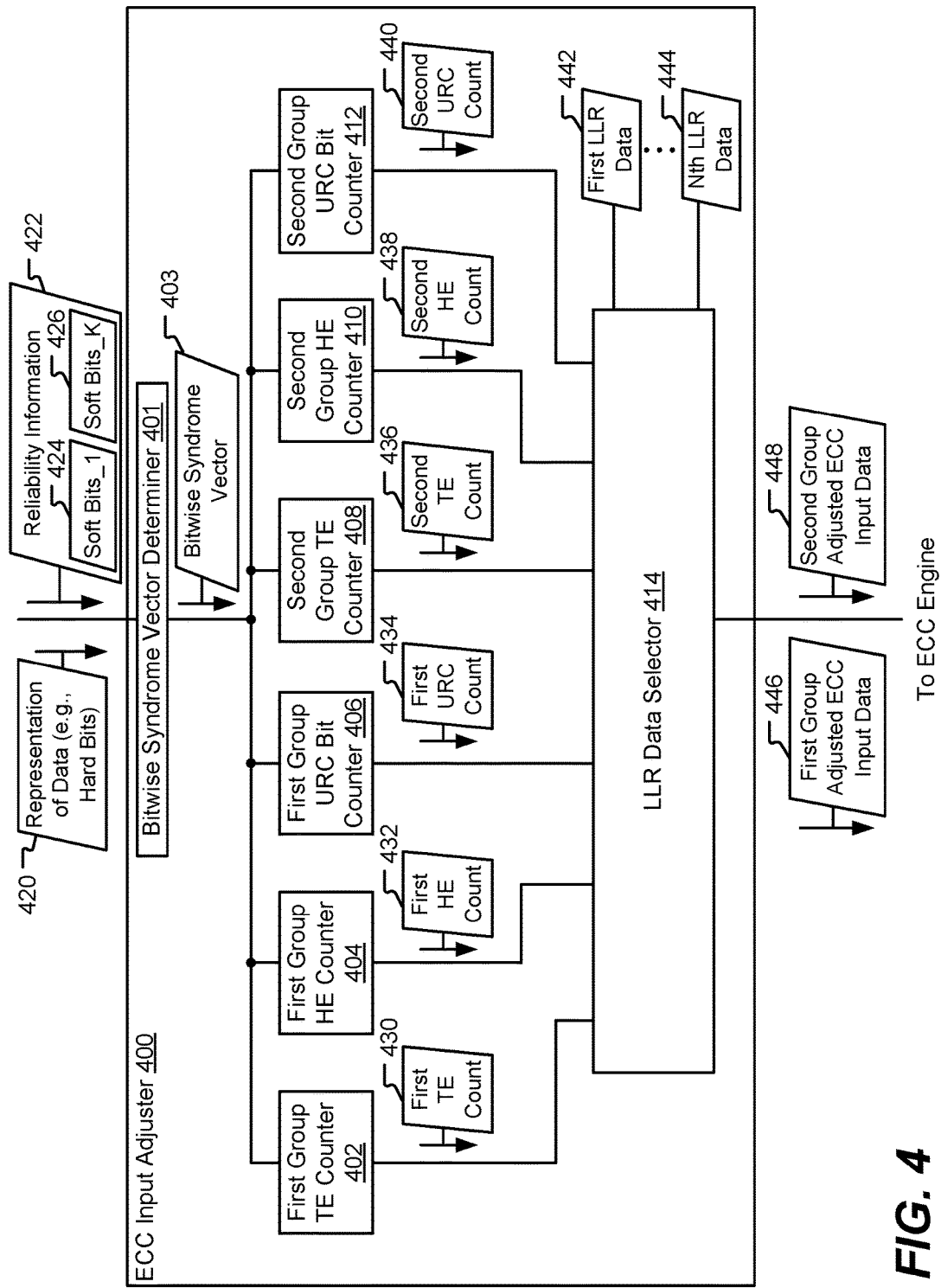
FIG. 4 is a block diagram of a second illustrative example of an ECC input adjuster.

Referring to FIG. 4, a second illustrative example of an ECC input adjuster is shown and generally designated 400. The ECC input adjuster 400 may include or correspond to the ECC input adjuster 162 of FIG. 1. The ECC input adjuster 400 includes a bitwise syndrome vector determiner 401, a first group TE counter 402, a first group HE counter 404, a first group URC bit counter 406, a second group TE counter 408, a second group HE counter 410, a second group URC bit counter 412, and a LLR data selector 414. Although FIG. 4 illustrate two groups of counters (e.g., the counters 402-406 and the counters 408-412), in other implementations, more than two groups of counters may be included to enable the ECC input adjuster 400 to process more than two groups of bits. Alternatively, a single group of counters may be used, and the counters may process each group of bits independently (e.g., error counts for each group of bits may be generated independently). In other implementations, the ECC input adjuster 400 may include a first group URE counter, a second group URE counter, a first group RC bit counter, and a second group RC bit counter.

The bitwise syndrome vector determiner 401 may be configured to generate a bitwise syndrome vector 403 based on a representation of data 420 and reliability information 422. The representation of data 420 may include one or more hard bits, and the reliability information 422 may include soft bits, such as first soft bits 424 (Soft Bits_1) and Kth soft bits 426 (Soft Bits_K). The representation of data 420 may include or correspond to the representation of data 140 of FIG. 1, and the reliability information 422 may include or correspond to the reliability information 142 of FIG. 1. The bitwise syndrome vector determiner 401 may be configured to generate the bitwise syndrome vector 403 by determining the number of unsatisfied parity checks that each bit of the representation of data 420 participates in, as described with reference to FIGS. 1-2.

The ECC input adjuster 400 may divide the bits of the representation of data 420 (e.g., the hard bits) into multiple groups. As an example, the bits of the representation of data 420 may divided into groups based on the number of unsatisfied parity checks the bits participate in (e.g., the value of the corresponding element of the bitwise syndrome vector 403). To illustrate, a first group of bits may include bits that participate in one unsatisfied parity check and a second group of bits may include bits that participate in two unsatisfied parity checks. As another example, the bits of the representation of data 420 may be divided into groups based on hard bit value. To illustrate, a first group of bits may include the bits of the representation of data 420 that have a logical "0" value, and a second group of bits may include the bits of the representation of data 420 that have a logical "1" value.

The first group TE counter 402 may be configured to determine a first TE count 430 for the first group of bits based on the bitwise syndrome vector 403. For example, the first group TE counter 402 may be configured to determine the number of elements of the bitwise syndrome vector 403 that correspond to the first group of bits and that that are greater than or equal to an upper threshold. The first group HE counter 404 may be configured to determine a first HE count 432 for the first group of bits based on the bitwise syndrome vector 403 and the reliability information 422. For example, the first group HE counter 404 may be configured to determine the number of elements of the bitwise syndrome vector 403 that correspond to the first group of bits, that are greater than or equal to the upper threshold, and that correspond to a soft bit having a high reliability (e.g., a soft bit that has a logical "0" value). The first group URC bit counter 406 may be configured to determine a first URC bit count 434 for the first group of bits based on the bitwise syndrome vector 403 and the reliability information 422. For example, the first group URC bit counter 406 may be configured to determine the number of elements of the bitwise syndrome vector 403 that correspond to the first group of bits, that are less than or equal to a lower threshold, and that correspond to a soft bit having a low reliability (e.g., a soft bit that has a logical "1" value).

The second group TE counter 408 may be configured to determine a second TE count 436 for the second group of bits based on the bitwise syndrome vector 403. The second group HE counter 410 may be configured to determine a second HE count 438 for the second group of bits based on the bitwise syndrome vector 403 and the reliability information 422. The second group URC bit counter 412 may be configured to determine a second URC bit count 440 for the second group of bits based on the bitwise syndrome vector 403 and the reliability information 422.

The LLR data selector 414 may be configured to select LLR data for the first group of bits based on the first TE count 430, the first HE count 432, and the first URC bit count 434. The LLR data selector 414 may be further configured to select LLR data for the second group of bits based on the second TE count 436, the second HE count 438, and the second URC bit count 440. To illustrate, the LLR data selector 414 may be configured to access a plurality of sets of LLR data, including first LLR data 442 and Nth LLR data 444. Each set of LLR data may indicate an LLR table, and each set of LLR data may correspond to a TE count value, a HE count value, and a URC bit count value. The LLR data selector 414 may be configured to select LLR data having the TE count value, the HE count value, and the URC bit count value that match (or most closely match) the TE count, the HE count, and the URC count for a group of bits. For example, the LLR data selector 414 may select the first LLR data 442 for the first group of bits based on a determination that the TE count value, the HE count value, and the URC bit count value associated with the first LLR data 442 match (or most closely match) the first TE count 430, the first HE count 432, and the first URC bit count 434, respectively. The LLR data selector 414 may select the Nth LLR data 444 for the second group of bits based on a determination that the TE count value, the HE count value, and the URC bit count value associated with the Nth LLR data 444 match (or most closely match) the second TE count 436, the second HE count 438, and the second URC bit count 440, respectively. In this manner, different LLR data may be selected for different groups of bits.

The selected LLR data for each group of bits may be provided as adjusted ECC input data to an ECC engine, such as the ECC engine 168 of FIG. 1. For example, the LLR data selector 414 may be configured to provide the first LLR data 442 as first group adjusted ECC input data 446 and to provide the Nth LLR data 444 as second group adjusted ECC input data 448. Although the LLR data selector 414 is described as selecting the LLR data based on the counts 430-440, in other implementations, the first group URC bit counter 406 and the second group URC bit counter 412 are not included in the ECC input adjuster 400 and the LLR data selector 414 selects the LLR data based on the first TE count 430, the first HE count 432, the second TE count 436, and the second HE count 438. In other implementations, the LLR data selector 414 may be replaced with a LLR data generator that is configured to compute LLR data based on the counts 430-440, as described with reference to FIG. 1.

The ECC input adjuster 400 may improve decoding performed by an ECC engine. For example, the ECC input adjuster 400 may select LLR data (e.g., generate an adjusted decode parameter) that more accurately reflects the actual errors in a group of bits of a representation of data than static LLR data (e.g., data indicative of a static LLR table). LLR data that more accurately reflects the actual errors in the representation of data improves performance of the ECC engine when decoding the representation of data. Additionally, selecting different LLR data for different groups of bits may enable the ECC engine to use LLR data associated with higher reliability with a group of bits that are more reliable (e.g., that are associated with fewer unsatisfied parity checks), which may improve decoding of the group of bits as compared to other groups of bits. Decoding different groups of bits using different LLR data (e.g., different decode parameters) may improve decoding of data that is read using a channel that is not symmetric (e.g., a channel where more errors occur in association with one state than with another state).

Figure 5:
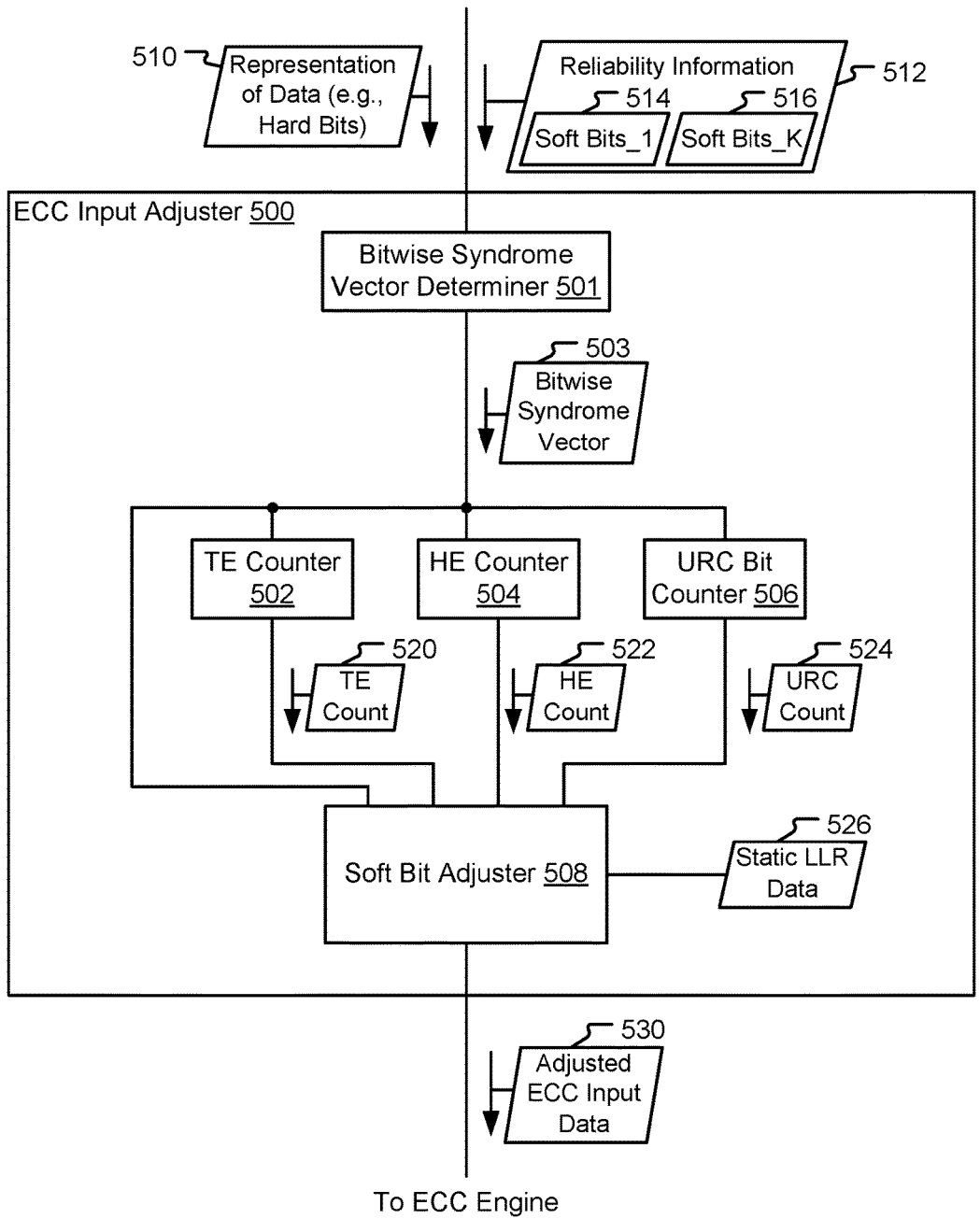
FIG. 5 is a block diagram of a third illustrative example of an ECC input adjuster.

Referring to FIG. 5, a third illustrative example of an ECC input adjuster is shown and generally designated 500. The ECC input adjuster 500 may include or correspond to the ECC input adjuster 162 of FIG. 1. The ECC input adjuster 500 includes a bitwise syndrome vector determiner 501, a TE counter 502, a HE counter 504, a URC bit counter 506, and a soft bit adjuster 508. In other implementations, the ECC input adjuster 500 may include a URE counter and a RC bit counter.

The bitwise syndrome vector determiner 501 may be configured to generate a bitwise syndrome vector 503 based on a representation of data 510 and reliability information 512. The representation of data 510 may include one or more hard bits, and the reliability information 512 may include soft bits, such as first soft bits 514 (Soft Bits_1) and Kth soft bits 516 (Soft Bits_K). The representation of data 510 may include or correspond to the representation of data 140 of FIG. 1, and the reliability information 512 may include or correspond to the reliability information 142 of FIG. 1. The bitwise syndrome vector determiner 501 may be configured to generate the bitwise syndrome vector 503 by determining the number of unsatisfied parity checks that each bit of the representation of data 510 participates in, as described with reference to FIGS. 1-2.

The TE counter 502 may be configured to determine a TE count 520 based on the bitwise syndrome vector 503. For example, the TE counter 502 may be configured to determine the number of elements of the bitwise syndrome vector 503 that that are greater than or equal to an upper threshold. The HE counter 504 may be configured to determine a HE count 522 based on the bitwise syndrome vector 503 and the reliability information 512. For example, the HE counter 504 may be configured to determine the number of elements of the bitwise syndrome vector 503 that are greater than or equal to the upper threshold and that correspond to a soft bit having a high reliability (e.g., a soft bit that has a logical "0" value). The URC bit counter 506 may be configured to determine a URC bit count 524 based on the bitwise syndrome vector 503 and the reliability information 512. For example, the URC bit counter 506 may be configured to determine the number of elements of the bitwise syndrome vector 503 that are less than or equal to a lower threshold and that correspond to a soft bit having a low reliability (e.g., a soft bit that has a logical "1" value).

The soft bit adjuster 508 may be configured to adjust one or more soft bits (e.g., of the first soft bits 514 or the Kth soft bits 516) based on the TE count 520, the HE count 522, and the URC bit count 524. For example, the soft bit adjuster 508 may be configured to change a value of one or more soft bits (e.g., adjust a decode parameter) from a high reliability to a low reliability in response to a determination that the HE count 522 exceeds a first threshold. As another example, the soft bit adjuster 508 may be configured to change a value of one or more soft bits from a low reliability to a high reliability in response to a determination that the URC bit count 524 exceeds a second threshold. Alternatively, the soft bit adjuster 508 may be configured to adjust values of soft bits based on the bitwise syndrome vector 503. The soft bits may be adjusted according to the following:

$$\widetilde{SB}_j = \begin{cases} 0 & \text{if } SB_j = 1 \text{ \& } q_j \geq thu \\ 1 & \text{if } SB_j = 0 \text{ \& } q_j \leq thl \\ SB_j & \text{otherwise} \end{cases} \quad \text{(Equation 7)}$$

In Equation 7, $SB_j$ is the jth soft bit, $\widetilde{SB}_j$ is the jth adjusted soft bit, $q_j$ is the jth bit of the bitwise syndrome vector, thu is the upper threshold, and thl is the lower threshold.

The soft bit adjuster 508 may be configured to provide the adjusted soft bits as adjusted ECC input data 530 to an ECC engine, such as the ECC engine 168 of FIG. 1. The soft bit adjuster 508 may also provide static LLR data 526 (e.g., data indicative of a static LLR table, such as a default LLR table) to the ECC engine. Alternatively, the ECC input adjuster may include an LLR data selector, such as the LLR data selector 308 described with reference to FIG. 3, that is configured to select LLR data based on the TE count 520, the HE count 522, and optionally the URC bit count 524.

The ECC input adjuster 500 may improve decoding performed by an ECC engine. For example, the ECC input adjuster 500 may adjust soft bits based the bitwise syndrome vector 503. Adjusting the soft bit values in this manner may reduce a number of HEs and URC bits, which may improve performance of an ECC engine that receives default LLR data.

Figure 6:
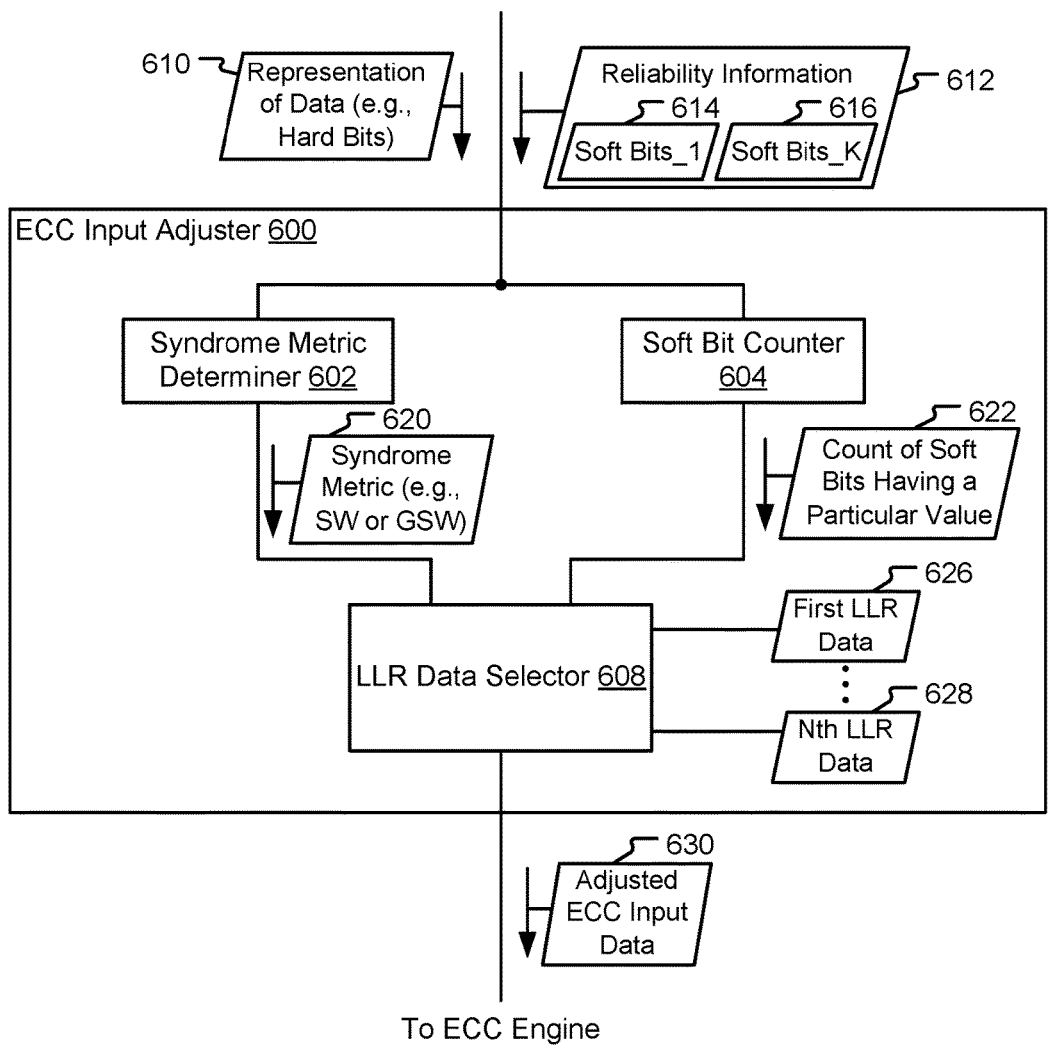
FIG. 6 is a block diagram of a fourth illustrative example of an ECC input adjuster.

Referring to FIG. 6, a fourth illustrative example of an ECC input adjuster is shown and generally designated 600. The ECC input adjuster 600 may include or correspond to the ECC input adjuster 162 of FIG. 1. The ECC input adjuster 600 includes a syndrome metric determiner 602, a soft bit counter 604, and a LLR data selector 608.

The syndrome metric determiner 602 may be configured to generate a syndrome metric 620 based on a representation of data 610 and reliability information 612. The representation of data 610 may include one or more hard bits, and the reliability information 612 may include soft bits, such as first soft bits 614 (Soft Bits_1) and Kth soft bits 616 (Soft Bits_K). The representation of data 610 may include or correspond to the representation of data 140 of FIG. 1, and the reliability information 612 may include or correspond to the reliability information 142 of FIG. 1. The syndrome metric 620 may include a syndrome weight or a generalized syndrome weight. The syndrome metric determiner 602 may be configured to determine a syndrome weight by determining a number of check nodes that are unsatisfied by the representation of data 610, as described with reference to FIGS. 1-2. Additionally or alternatively, the syndrome metric determiner 602 may be configured to determine a generalized syndrome weight by determining the number of bit nodes with i unsatisfied parity checks for each value of i between zero and the variable node degree of the bit nodes, as described with reference to FIGS. 1-2.

The soft bit counter 604 may be configured to determine a count 622 of soft bits having a particular value based on the reliability information 612. For example, the soft bit counter 604 may be configured to determine a count of soft bits included in the reliability information 612 that have a particular value. In a particular implementation, the particular value is a logical "0" value. In other implementations, the particular value is a logical "1" value or another value (e.g., a multibit value).

The LLR data selector 608 may be configured to select LLR data based on the syndrome metric 620 and the count 622. To illustrate, the LLR data selector 608 may be configured to access a plurality of sets of LLR data, including first LLR data 626 and Nth LLR data 628. Each set of LLR data may indicate an LLR table, and each set of LLR data may correspond to a syndrome metric value and a count value (e.g., a count of soft bits). The LLR data selector 608 may be configured to select LLR data having the syndrome metric value and the count value that match (or most closely match) the syndrome metric 620 and the count 622. For example, the LLR data selector 608 may select the first LLR data 626 based on a determination that the syndrome metric value and the count value associated with the first LLR data 626 match (or most closely match) the syndrome metric 620 and the count 622, respectively.

The selected LLR data may be provided as adjusted ECC input data 630 to an ECC engine, such as the ECC engine 168 of FIG. 1. For example, the LLR data selector 608 may be configured to adjust ECC input data (e.g., adjust a decode parameter) by replacing default LLR data with the selected LLR data.

The ECC input adjuster 600 may improve decoding performed by an ECC engine. For example, the ECC input adjuster 600 may select LLR data that more accurately reflects the actual errors in a representation of the data than static LLR data (e.g., data indicative of a static LLR table). LLR data that more accurately reflects the actual errors in the representation of data improves performance of the ECC engine when decoding the representation of data. For example, the ECC engine may use the adjusted ECC input data 630 (e.g., the selected LLR data) to decode the representation of data faster, and with reduced power consumption, as compared to decoding the representation of data using static LLR data.

Figure 7:
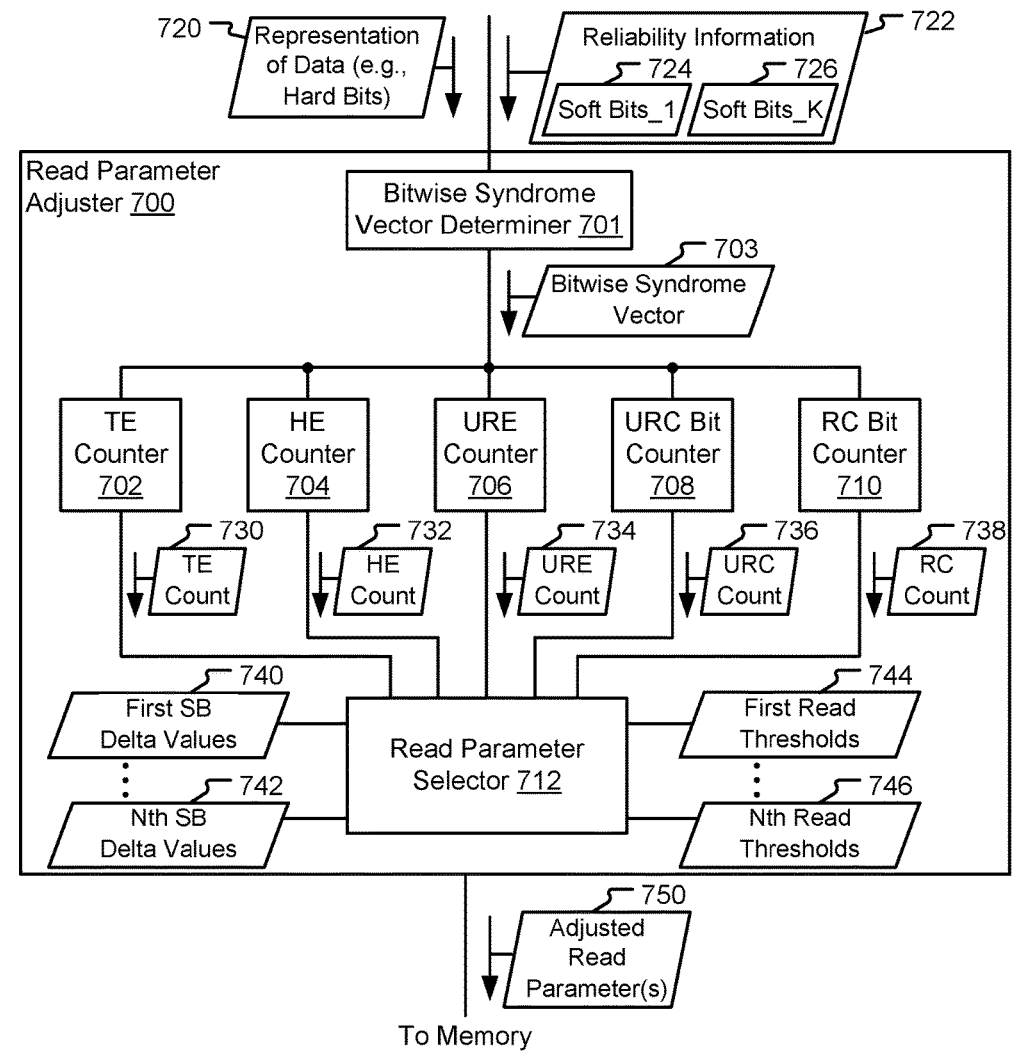
FIG. 7 is a block diagram of an illustrative example of a read parameter adjuster.
Figure 7:
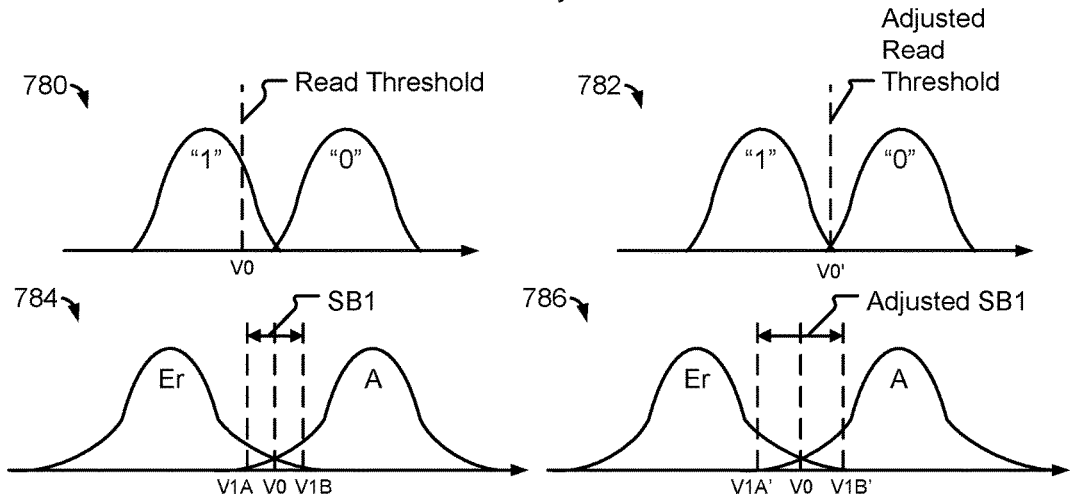

Referring to FIG. 7, an illustrative example of a read parameter adjuster is shown and generally designated 700. The read parameter adjuster 700 may include or correspond to the read parameter adjuster 161 of FIG. 1. The read parameter adjuster 700 includes a bitwise syndrome vector determiner 701, a TE counter 702, a HE counter 704, a URE counter 706, a URC bit counter 708, a RC bit counter 710, and a read parameter selector 712. In other implementations, the read parameter adjuster 700 may include more or fewer components, such as fewer counters, than illustrated in FIG. 7.

The bitwise syndrome vector determiner 701 may be configured to generate a bitwise syndrome vector 703 based on a representation of data 720 and reliability information 722. The representation of data 720 may include one or more hard bits, and the reliability information 722 may include soft bits, such as first soft bits 724 (Soft Bits_1) and Kth soft bits 726 (Soft Bits_K). The representation of data 720 may include or correspond to the representation of data 140 of FIG. 1, and the reliability information 722 may include or correspond to the reliability information 142 of FIG. 1. The bitwise syndrome vector determiner 701 may be configured to generate the bitwise syndrome vector 703 by determining the number of unsatisfied parity checks that each bit of the representation of data 720 participates in, as described with reference to FIGS. 1-2.

The TE counter 702 may be configured to determine a TE count 730 based on the bitwise syndrome vector 703. For example, the TE counter 702 may be configured to determine the number of elements of the bitwise syndrome vector 703 that have a value that is greater than or equal to an upper threshold (e.g., a threshold indicating a number of unsatisfied parity checks that is associated with an error). The HE counter 704 may be configured to determine a HE count 732 based on the bitwise syndrome vector 703 and the reliability information 722. For example, the HE counter 704 may be configured to determine the number of elements of the bitwise syndrome vector 703 that have a value that is greater than or equal to the upper threshold and that correspond to a soft bit having a high reliability (e.g., a soft bit that has a logical "0" value). The URE counter 706 may be configured to determine a URE count 734 based on the bitwise syndrome vector 703 and the reliability information 722. For example, the URE counter 706 may be configured to determine the number of elements of the bitwise syndrome vector 703 that have a value that is greater than or equal to the upper threshold and that correspond to a soft bit having a low reliability (e.g., a soft bit that has a logical "1" value). The URC bit counter 708 may be configured to determine a URC bit count 736 based on the bitwise syndrome vector 703 and the reliability information 722. For example, the URC bit counter 708 may be configured to determine the number of elements of the bitwise syndrome vector 703 that have a value that is less than or equal to a lower threshold (e.g., a threshold indicating a number of unsatisfied parity checks that is associated with a correct bit) and that correspond to a soft bit having a low reliability. The RC bit counter 710 may be configured to determine a RC bit count 738 based on the bitwise syndrome vector 703 and the reliability information 722. For example, the RC bit counter 710 may be configured to determine the number of elements of the bitwise syndrome vector 703 that have a value that is less than or equal to the lower threshold and that correspond to a soft bit having a high reliability.

In some implementations, the counters 702-710 may generate first count values for a first group of bits (e.g., bits having a first logical value) and second count values for a second group of bits (e.g., bits having a second logical value). To illustrate, $TE_0$ refers to a TE count value for bits having a logical "0" value, and $TE_1$ refers to a TE count having a logical "1" value.

The read parameter selector 712 may be configured to select read thresholds or soft bit delta values based on the TE count 730, the HE count 732, the URE count 734, the URC bit count 736, and the RC bit count 738. To illustrate, the read parameter selector 712 may be configured to access a plurality of soft bit delta values, including first soft bit delta values 740 and Nth soft bit delta values 742. The read parameter selector 712 may also be configured to access a plurality of read thresholds, including first read thresholds 744 and Nth read thresholds 746. Each set of soft bit values and each set of read thresholds may correspond to a TE count value, a HE count value, a URE count value, a URC bit count value, and a RC bit count value. The read parameter selector 712 may be configured to select read thresholds, soft bit delta values, or both, having the TE count value, the HE count value, the URE count value, the URC bit count value, and the RC bit count value that match (or most closely match) the TE count 730, the HE count 732, the URE count 734, the URC bit count 736, and the RC bit count 738. For example, the read parameter selector 712 may select the first read thresholds 744, the first soft bit delta values 740, or both based on a determination that the TE count value, the HE count value, the URE count value, the URC bit count value, and the RC bit count value associated with the first read thresholds 744 and the first soft bit delta values 740 match (or most closely match) the TE count 730, the HE count 732, the URE count 734, the URC bit count 736, and the RC bit count 738 respectively.

The selected read thresholds, the selected soft bit delta values, or both, may be provided as adjusted read parameters 750 to a memory, such as the memory 104 of FIG. 1. The adjusted read parameters 750 may be used during a subsequent read of a group of storage elements corresponding to the representation of data 720. In other implementations, the read parameter selector 712 may be configured to compute adjusted read parameter values (or modifications to read parameters) based on the TE count 730, the HE count 732, the URE count 734, the URC bit count 736, and the RC bit count 738.

To illustrate, histogram 780 illustrates a cell voltage distribution (CVD) and a first read threshold used during a first read operation. The first read threshold (V0) may be a default or static read threshold that is determined based on a default CVD model and stored in a data storage device. In some situations, an estimated CVD may not match the default CVD model, and thus a default read threshold may be shifted to the left (as in the histogram 780) or to the right of a target voltage (e.g., a voltage that is substantially equidistant between a first voltage associated with a highest percentage of storage elements storing a logical "1" value and a second voltage associated with a highest percentage of storage elements storing a logical "0" value. These situations may be referred to as "unbalanced." An unbalanced CVD may be indicated by the error counts. For example, if error counts generated based on read data do not have a substantially 50/50 distribution between errors associated with a first logical value and errors associated with a second logical value, an unbalanced CVD is indicated. If the error counts (e.g., TE, HE, and URE) for the storage elements storing a first logical value are greater than the error counts for storage elements storing a second logical value (or exceed a first threshold), if the correct bit counts (e.g., URC and RC) for the storage elements storing the first logical value are less than the correct bit counts for the storage elements storing the second logical value (or fail to exceed a second threshold), or both, the estimated CVD may be unbalanced and the read threshold may be too low or too high, depending on the corresponding voltages of the first and second logical values.

To illustrate, in the histogram 780, the read threshold (e.g., V0) is too low, and the error counts and correct bit counts do not have a substantially equal distribution between bits having the logical "1" and bits having the logical "0" value. To compensate for the unbalanced estimated CVD, the read parameter selector 712 may increase the read threshold to an adjusted read threshold V0', as illustrated in histogram 782. In some implementations, the read parameter selector 712 selects the modified read threshold V0' from stored read thresholds using the count values as indices. Alternatively, the read parameter selector 712 may determine that there are more errors associated with bits having the logical "1" value and may increase the read threshold V0 to generate the adjusted read threshold V0' using an iterative process (e.g., the read threshold may be increased until error counts associated with bits having both logical values are substantially equal). Substantially equal refers to values within a range of values and that may not be exactly equal. The range of values may be determined based on design margins, tolerances, or other factors.

The soft bit delta values may also be modified in a similar manner. Histogram 784 illustrates a situation where the "tails" of the estimated CVD model are longer than a default CVD model. In these situations, the default soft bit delta value V1, which defines the soft bit range SB1 from V1A to V1B (e.g., from V0−V1 to V0+V1), may result in error counts that indicate too few bits are considered unreliable (e.g., if the HE count exceeds a first threshold, if the RC bit count fails to exceed a second threshold, or if the URC count fails to exceed a third threshold). To compensate, the read parameter selector 712 may increase the soft bit delta value, as illustrated in histogram 786. Increasing the soft bit delta value to an adjusted value V1' increases the soft bit range SB1 to a range from V1A' to V1B' (e.g., V0−V1' to V0+V1'). The increased soft bit range may increase the number of bits that are indicated as unreliable, which may increase speed and efficiency of a decoding process. Alternatively, in situations where the error counts indicate that the number of unreliable bits (e.g., the URE count or the URC bit count) fail to exceed corresponding thresholds, the soft bit range may be able to be decreased without significantly increasing the number of hard errors. Decreasing the soft bit delta value in these situations may increase the speed and efficiency of a decoding process.

Thus, the read parameter adjuster 700 may improve decoding performed by an ECC engine by improving the reliability of read data or decreasing the number or errors in read data. For example, the read parameter adjuster 700 may adjust a read parameter (e.g., a read threshold or a soft bit delta value) to an adjusted value that more accurately reflects an estimated CVD of a group of storage elements. During subsequent read operations at the group of storage elements using the adjusted read parameter, a representation of data may have fewer errors or may have a more accurate indication of reliability, which enables an ECC engine to decode the representation of data faster, and with reduced power consumption.

FIGS. 1-7 describe implementations where one or more estimated error counts (e.g., the TE count, the HE count, the URE count, the URC bit count, and the RC bit count) are used to retrieve or to calculate adjusted decoded parameters and adjusted read parameters. In some implementations, additional count values based on joint statistics of the syndrome (e.g., the bitwise syndrome vector) and the hard bit and soft bit data from the memory, and the additional count values may be used to estimate an error model of the memory. For example, the additional count values may be used by the controller 120 to estimate the error model 169 of FIG. 1. LLR values (e.g., adjusted decode parameters) may be determined based on the estimated error model.

To estimate the error model, the controller 120 of FIG. 1 may be configured to generate counter values $C_r^q$ that count a number of bits $b_j$ that participate in q unsatisfied parity checks and have a read value of r. As a particular example, for storage elements that are read with a resolution of three bits (e.g., [HB SB1 SB2]), the read value r may be defined as the decimal representation of the read bits of the corresponding storage element (e.g., if the storage element is read with resolution of $\log_2(L)=3$ bits: [$HB_j$ $SB1_j$ $SB2_j$], then $r_j=HB_j \cdot 2^2+SB1_j \cdot 2^1+SB2_j \cdot 2^0$ is an integer between 0 and L, where L is the number of possible read values for a storage element), and q is a number between 0 and $d_v$ (e.g., the number of parity checks that each bit participates in). The counter values $C_r^q$ can be computed as part of a decoder initialization process using the hard bits and soft bits of a representation of data and the bitwise syndrome vector. Additionally, the number of bits whose storage elements are read with value r can be derived from the computed counters as:

$$C_r = \sum_{q=0}^{d_v} C_r^q.$$

As an example, assuming each bit participates in 4 parity checks ($d_v=4$) and assuming that the memory is read with 3 bit resolution (corresponding to a HB page, a first soft bit (SB1) page, and a second soft bit (SB2) page), then the joint statistics of the syndrome and the read hard bits and soft bits can be captured by the following set of counters:

TABLE 1

| Number of unsatisfied | HB, SB0, SB1 | | | | |
|---|---|---|---|---|---|
| parity checks | 000 | 001 | 010 | ... | 111 |
| 0 | $C_0^0$ | $C_1^0$ | $C_2^0$ | ... | $C_7^0$ |
| 1 | $C_0^1$ | $C_1^1$ | $C_2^1$ | ... | $C_7^1$ |
| ... | ... | ... | ... | ... | ... |
| 4 | $C_0^4$ | $C_1^4$ | $C_2^4$ | ... | $C_7^4$ |

In Table 1, the counter value $C_r^q$ can be computed by:

$$C_r^q = |\{j : (HB_j \cdot 2^2 + SB1_j \cdot 2^1 + SB2_j \cdot 2^0 = r) \text{ and } (q_j = q)\}|$$

This set of counters may be generated as part of a decoder initialization process using a simple hardware circuit.

A memory error model $\underline{E}$ is defined as $\underline{E}=[E_0 \ E_1 \ldots E_{L-1}]$, where Er is the number of bit errors within the group of bits having the read value r. A bit error rate (BER) for a cell having a read value of r may be defined as $BER_r=E_r/C_r$. An LLR value to be assigned to a bit j having a read value r is given by the following:

$$LLR_j(r) = \qquad \text{(Equation 8)}$$
$$(1 - 2 \cdot HB_j) \cdot \log \frac{1 - BER_r}{BER_r} = (1 - 2 * HB_j) * \log \frac{C_r - E_r}{E_r}$$

Based on Equation 8, adjusted LLR values may be determined based on hard bit values, the counter values, $$C_r = \sum_{q=0}^{d_v} C_r^q$$

and an estimated error model values $E_r$. In a particular implementation, an error model $\underline{\tilde{E}}$ that best fits the computed counter values is estimated using one or more methods or metrics, such as a Maximal Likelihood (ML), a Maximal A-Posteriori Probability (MAP), or a Minimal Euclidean Distance (aka "Least Squares"), as defined below (where $\underline{\tilde{C}}/\underline{E}$ are the expected counters values given a conjectured memory error model $\underline{E}$):

$$ML: \ \tilde{E}(C) = \max_E Pr(C \mid E)$$

$$MAP: \ \tilde{E}(C) = \max_E Pr(E \mid C) = \max_E Pr(C \mid E) \cdot Pr(E)$$

$$\text{Minimal Euclidean Distance:} \ \tilde{E}(C) = \min_E \left[ (C - \tilde{C} \mid E)^2 \right]$$

As a basis for the estimation methods, additional values, such as bit error rate values and probability values of bits satisfying (or unsatisfying) parity checks may be determined. Under an estimated error model $\underline{\tilde{E}}$, a bit error rate is given by the following, where N is the number of bits in the read data:

$$BER = \frac{1}{N} * \sum_{r=0}^{L-1} E_r \qquad \text{(Equation 9)}$$

The probability that a parity check is satisfied is equal to the probability that there is an even number of bit errors within the bits participating in the parity check. The probability that a parity check is unsatisfied is equal to the probability that there is an odd number of bit errors within the bits participating in the parity check. Based on the foregoing, the probability that a parity check is unsatisfied given that a bit b that participates in the parity check is erroneous is given by the following:

$$p_{u|e} = \frac{1 + (1 - 2*BER)^{d_c - 1}}{2} \quad \text{(Equation 10)}$$

The probability that a parity check is unsatisfied given that a bit b that participates in the parity check is correct is given by the following:

$$p_{u|c} = \frac{1 - (1 - 2*BER)^{d_c - 1}}{2} \quad \text{(Equation 11)}$$

A probability that bit b is erroneous and has q unsatisfied parity checks is given by the following, where $p_{u|e}$ is a function of BER (which is a function of $\underline{E}$):

$$p_{q|e}(E) = \binom{dv}{q} * p_{u|e}^q * (1 - p_{u|e})^{d_v - q} \quad \text{(Equation 12)}$$

A probability that bit b is correct and has q unsatisfied parity checks is given by the following, where $p_{u|e}$ is a function of BER (which is a function of $\underline{E}$):

$$p_{q|c}(E) = \binom{dv}{q} * p_{u|c}^q * (1 - p_{u|c})^{d_v - q} \quad \text{(Equation 13)}$$

Based on Equations 9-13, expected counter values $\underline{\hat{C}}|\underline{E}$ given a conjectured error model $\underline{E}$ may be computed by the following equation:

$$C_r^q | E = (P_{q|e}(E) - P_{q|c}(E)) * E_r + P_{q|c}(E) * C_r \quad \text{(Equation 14)}$$

Equation 14 can be used to estimate the error model $\underline{\tilde{E}}$ as the error model E that "best fits" the computed ("observed") count values $C_r^q$, where the "best fit" may be based on several metrics. In a particular implementation, the error model $\underline{\tilde{E}}$ is estimated using a Maximal Likelihood approach. In another particular implementation, the error model $\underline{\tilde{E}}$ is estimated using a A-Posteriori Probability approach. In another particular implementation, the error model $\underline{\tilde{E}}$ is estimated using a Minimal Squared Euclidean Distance approach. More specifically, $\underline{\tilde{E}}(\underline{C})$ may be estimated as the memory error model $\underline{E}$ which "optimizes" a selected metric:

Maximal Likelihood (ML):

$$\underline{\tilde{E}}(\underline{C}) = \max_{\underline{E}} Pr(\underline{C} | \underline{E}) \quad \text{(Equation 15)}$$

$$= \max_{\underline{E}} \sum_{r=0}^{L-1} \sum_{q=0}^{d_v} C_r^q \cdot \log((P_{q|e}(\underline{E}) - P_{q|c}(\underline{E})) \cdot E_r +$$

$$P_{q|c}(\underline{E}) \cdot C_r)$$

Maximal A-Posteriori Probability (MAP):

$$\underline{\tilde{E}}(\underline{C}) = \max_{\underline{E}} Pr(\underline{E} | \underline{C}) \quad \text{(Equation 16)}$$

$$= \max_{\underline{E}} Pr(\underline{C} | \underline{E}) \cdot Pr(\underline{E})$$

$$= \max_{\underline{E}} \sum_{r=0}^{L-1} \sum_{q=0}^{d_v} C_r^q \cdot \log((P_{q|e}(\underline{E}) - P_{q|c}(\underline{E})) \cdot E_r +$$

$$P_{q|c}(\underline{E}) \cdot C_r) \cdot Pr(\underline{E})$$

Minimal Squared Euclidean Distance (aka Least Squares):

$$\underline{\tilde{E}}(\underline{C}) = \max_{\underline{E}} \left[ \left( \underline{C} - \underline{\tilde{C}} \mid \underline{E} \right)^2 \right] \quad \text{(Equation 17)}$$

$$= \max_{\underline{E}} \sum_{r=0}^{L-1} \sum_{q=0}^{d_v} \left( C_r^q - \tilde{C}_r^q \mid \underline{E} \right)^2$$

$$= \max_{\underline{E}} \sum_{r=0}^{L-1} \sum_{q=0}^{d_v} (C_r^q - (P_{q|e}(E) - P_{q|c}(E)) \cdot E_r -$$

$$P_{q|c}(\underline{E}) \cdot C_r)^2$$

For the case of Equation 16, an a-priori probability Pr ($\underline{E}$) for each error model is assumed. Once $\underline{\tilde{E}} = [\tilde{E}_0\ \tilde{E}_1\ \tilde{E}_{L-1}\ \ldots]$ is computed, $\tilde{E}_r$ may be substituted for $E_r$ in Equation 8 to determine an LLR value for a bit $b_r$.

In some implementations, data indicating LLR values as a function of the computed counters C may be stored in a memory (e.g., at least part of the calculations are not performed by the controller 120). For example, the controller memory 172 of FIG. 1 may store the linear regression data 174. As one example, a precomputed table of LLR values that is indexed by the computed counters C may be stored in a memory and accessed to determine LLR values based on the computed counters C. Such a table may be large and memory-intensive.

In another particular implementation, weighting values $W_r^q$, $W_r$, and $W^q$ that are based on a linear regression algorithm that finds a linear approximation for LLRs as a function of counters or some transformation of the counters (such as log of the counters) may be stored in a memory. For example, the linear regression data 174 of FIG. 1 may include data indicative of the weighting values $W_r^q$, $W_r$, and $W^q$. As an example, a linear regression algorithm may be used for finding a linear approximation of the LLR values as a function of log 2 of the counters. In this case the LLRs may be given by the following linear equation:

$$|LLR(r)| = \log \frac{C_r - \tilde{E}_r}{\tilde{E}_r} \quad \text{(Equation 18)}$$

$$\cong \sum_{q=0}^{d_v} \sum_{r=0}^{L-1} W_r^q \cdot \log_2(C_r^q) + \sum_{r=0}^{L-1} W_r \cdot \log_2(C_r) +$$

$$\sum_{q=0}^{d_v} W^q \cdot \log_2(C^q)$$

In another particular implementation, a Lagrange multipliers technique may be used to determine the estimated error model $\tilde{E}$ via a closed form expression. As an example, this may be done for the minimum squared Euclidean distance metric. In order to simplify the implementation, the estimation may be done based on the following stages. First, the BER may be estimated according to a syndrome weight (based on Equations 10 and 11):

$$BER = \frac{1}{2} - \frac{1}{2} \cdot \left(1 - \frac{2 \cdot SW}{M}\right)^{1/d_c} \quad \text{(Equation 19)}$$

In Equation 19, M is the number of parity check equations, and the syndrome weight (SW) is determined by the following:

$$SW = \frac{1}{d_c} \sum_{r=0}^{L-1} \sum_{q=0}^{d_v} C_r^q. \quad \text{(Equation 20)}$$

Next, a Lagrange function is defined for the following minimization problem:

$$\tilde{E}(\underline{C}) = \min_{\underline{E}}\left[\left(\underline{C} - \tilde{\underline{C}} \mid \underline{E}\right)^2\right].$$

The derivatives of the Lagrange function may be equated to zero to obtain a closed for expression for the memory error model:

(Equation 21)

$$\Rightarrow \lambda = \frac{1}{L} \cdot \sum_{q=0}^{d_v}\left[BER \cdot N \cdot (P_{q|e}(BER) - P_{q|c}(BER))^2 + \right.$$

$$\left. \sum_{r=0}^{L-1}(C_r \cdot P_{q|c}(BER) - C_r^q) \cdot (P_{q|e}(BER) - P_{q|c}(BER))\right]$$

$$\Rightarrow \tilde{E}_r = \frac{\lambda - \sum_{q=0}^{d_v}(C_r \cdot P_{q|c}(BER) - C_r^q) \cdot (P_{q|e}(BER) - P_{q|c}(BER))}{\sum_{q=0}^{d_v}(P_{q|e}(BER) - P_{q|c}(BER))^2}$$

To facilitate the Lagrange multipliers technique, the BER as function of SW (as defined by Equation 19) may be implemented using a lookup table that may be stored in a memory, such as the controller memory 172 of FIG. 1. Additionally, probability data relating to unsatisfied parity checks (such as defined by Equations 12 and 13 as an example) may be stored as a function of syndrome weight in a lookup table or other data structure. For example, the bit error rate data 176 stored in the controller memory 172 of FIG. 1 may include the above-described bit error rate data and probability data. The bit error rate data 176 may be used to determine a closed form solution of the equations obtained by equating the derivative of a Lagrange function of $\tilde{E}$ to zero. In this manner, the estimated error model $\tilde{E}$ may be obtained as a function of the counter values C.

In another particular implementation, an efficient grid search is performed to determine the estimated error model $\tilde{E}$. To illustrate, according to Equation 15, a target cost function, such as the Likelihood function Pr($\underline{C}$|$\underline{E}$) for a Maximal Likelihood approach, may be computed over a grid (e.g., a matrix) of possible error models $\underline{E}$, and the possible error model $\underline{E}$ that maximizes (or minimizes) the target cost function may be searched for. To reduce complexity of the grid search, a full estimated error model $\tilde{\underline{E}}$ is estimated in L−1 stages. In each stage, a partial estimated error model $\tilde{\underline{E}}_1$ is determined for a single dimension of the grid, and the partial error models may be combined to determine the full estimated error model $\tilde{\underline{E}}$. This process reduces the complexity to a linear complexity (in L) of $O(L^*E_{max})$ as compared to the exponential (in L) complexity $O(E_{max}^L)$ of determining the estimated error model $\tilde{\underline{E}}$ in a single stage. Determining the partial estimated error models may include accessing the bit error rate data 176 (e.g., the bit error rate data and the probability data), as described above.

Determining the modified LLR values (e.g., the adjusted decode parameter) based on an estimated error model using the above-described techniques may generate a modified LLR value that more accurately represents the read data. Additionally or alternatively, determining an adjusted read parameter based on the estimated error model (as described above) may result in a read parameter that better accounts for the measured errors and bit counts associated with a representation of data.

In a particular implementation, a device (e.g., a data storage device) includes a memory and a controller coupled to the memory, such as the controller 120 coupled to the memory 104 of FIG. 1. The controller may be configured to determine an estimated memory error model associated with a representation of data based at least in part on the representation of data and reliability information associated with the representation of data. For example, the representation of data may include the representation of data 140 (e.g., the hard bits) and the reliability information 142 (e.g., the first soft bits 144 and the kth soft bits 146) of FIG. 1. The controller may be further configured to modify at least one read parameter or at least one decode parameter based on the estimated memory error model. For example, the controller may be configured to determine a read parameter, such as a read threshold of a soft bit delta value, or a decode parameter, such as LLR values, based on one or more of Equations 8, 15-17, and 19-21.

In a particular implementation, the controller may be configured to determine the estimated memory error model by computing at least two counts of bits of the representation of data that have different reliability information. For example, the controller may compute the counters described with reference to Table 1. In another particular implementation, the controller may be configured to correlate the reliability information with a bitwise syndrome vector corresponding to the representation of data to determine the estimated memory error model. For example, the controller may computer the counter values $C_r^q$ by correlating the bitwise syndrome vector with the read values and the reliability information (e.g., the hard bit pages and the soft bit pages).

In another particular implementation, the controller may be configured to determine the estimated memory error model based on joint statistics of syndrome information associated with the representation of data, the representation of data, and the reliability information. For example, the joint statistics of the syndrome information and the read hard bits and soft bits may be captured (e.g., determined) using a set of counters that indicate how many bits have a particular read value (i.e. certain hard bits and soft bits) and are associated with a particular number of unsatisfied parity checks. The joint statistics may include a first count of bits of the representation of data and a second count of bits of the representation of data, wherein the first count of bits have a reliability that is within a first reliability range and that are associated with a first number of unsatisfied parity check equations that are within an unsatisfied parity check equation range, and wherein the second count of bits have a reliability that is outside the first reliability range or that are associated with a second number of unsatisfied parity check equations that are outside of the unsatisfied parity check equation range. Additionally or alternatively, the estimated memory error model may be associated with estimated counter values that more closely match the joint statistics than estimated counter values of other estimated memory error models. For example, the controller may estimate the error model $\underline{\hat{E}}$ that "best fits" the computed count values $C_r^q$. The controller may be configured to determine the estimated memory error model based on a maximum likelihood analysis, a maximal a-posteriori probability analysis, or a minimum squared Euclidean distance between particular counts of bits of the representation of data and predicted counts of bits associated with the estimated memory error model. For example, the controller may determine the estimated memory error model using Equations 15-17.

Figure 8:
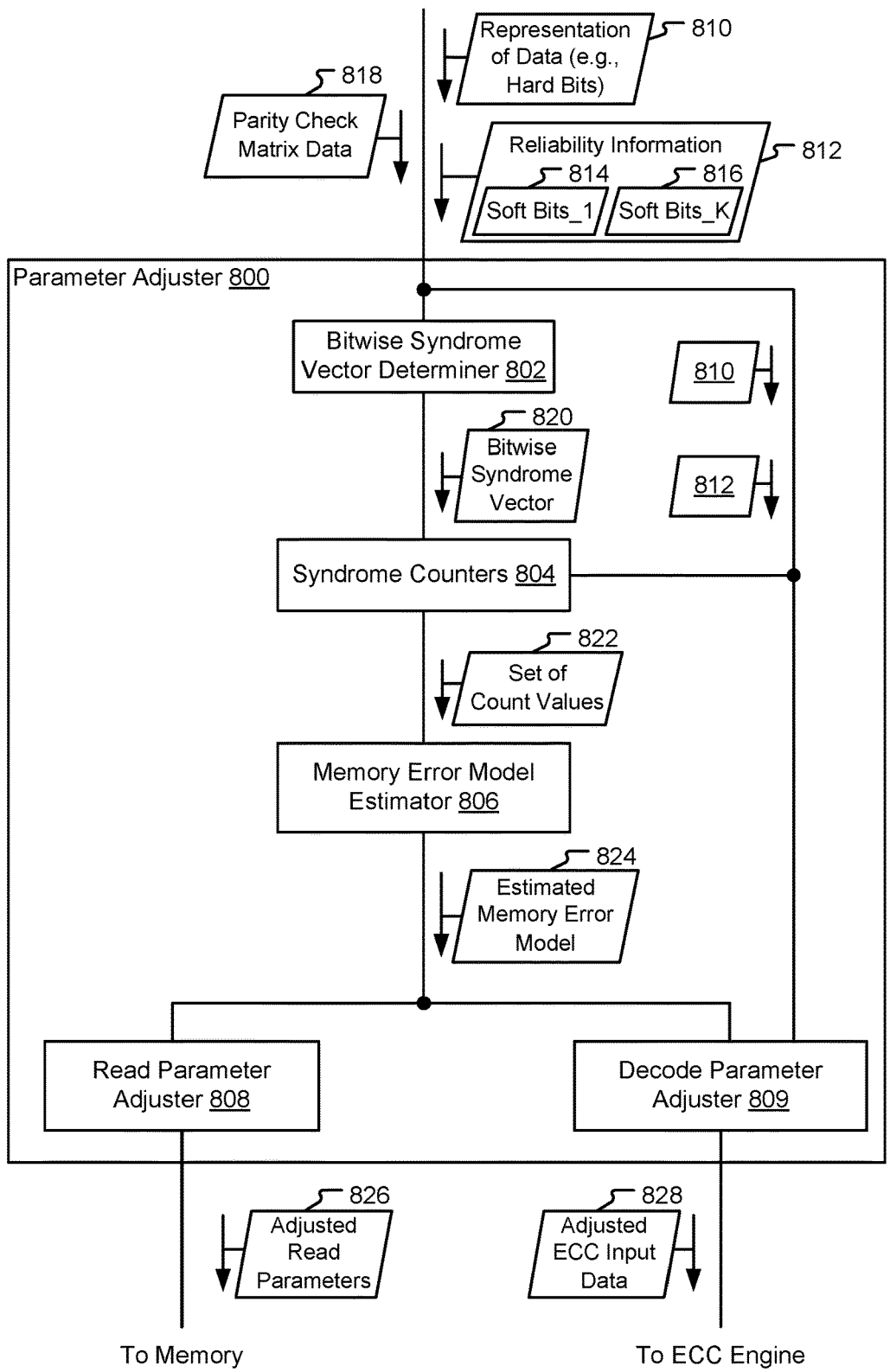
FIG. 8 is a block diagram of an illustrative example of a parameter adjuster.

Referring to FIG. 8, an illustrative example of a parameter adjuster is shown and generally designated 800. The parameter adjuster 800 includes or corresponds to the ECC input adjuster 162 of FIG. 1 or the read parameter adjuster 700 of FIG. 7. The parameter adjuster 800 includes a bitwise syndrome vector determiner 802, syndrome counters 804, a memory error model estimator 806, a read parameter adjuster 808, and a decode parameter adjuster 809. In other implementations, the parameter adjuster 800 may include more or fewer components. Although the bitwise syndrome vector determiner 802 is illustrated as being included in the parameter adjuster 800, in other implementations the bitwise syndrome vector determiner 802 is external to the parameter adjuster 800.

The bitwise syndrome vector determiner 802 may be configured to generate a bitwise syndrome vector 820 based on parity check matrix data 818, a representation of data 810, and reliability information 812 associated with the representation of data 810. The representation of data 810 may include one or more hard bits, and the reliability information 812 may include soft bits, such as first soft bits 814 (Soft Bits_1) and Kth soft bits 816 (Soft Bits_K). The representation of data 810 may include or correspond to the representation of data 140 of FIG. 1, and the reliability information 812 may include or correspond to the reliability information 142 of FIG. 1. The parity check matrix data 818 may include data that represents a parity check matrix associated with an ECC code used to encode data. In other implementations, the parity check matrix data 818 may be replaced with data that represents a bipartite graph that corresponds to the ECC code and that defines parity check constraints. The bitwise syndrome vector determiner 802 may be configured to generate the bitwise syndrome vector 820 by determining the number of unsatisfied parity checks that each bit of the representation of data 810 participates in, as described with reference to FIGS. 1-2.

The syndrome counters 804 may be configured to determine a set of syndrome counts 822 based on the bitwise syndrome vector 820, the representation of data 810, and the reliability information 812. For example, the syndrome counters 804 may be configured to determine the set of counter values $C_r^q$ (e.g., the set of syndrome counts 822), as described with reference to Table 1. The memory error model estimator 806 may be configured to determine an estimated memory error model 824 based on the set of syndrome counts 822. For example, the memory error model estimator 806 may be configured to determine the estimated memory error model 824 using one or more of Equations 14, 15, 16, or 19-21. For example, the estimated memory error model 824 may be estimated based on a Maximal Likelihood, a Maximal A-Posteriori Probability, or a Minimal Squared Euclidean Distance. The estimated memory error model 822 may represent the vectors $\underline{E}=[E_0 \ E_1 \ \ldots \ E_{L-1}]$ and $\underline{C}=[C_0 \ C_1 \ \ldots \ C_{L-1}]$. The read parameter adjuster 808 may be configured to generate adjusted read parameters 826 based on the estimated memory error model 824. For example, the read parameter adjuster 808 may adjust a read threshold or a soft bit delta value to "optimal" values (e.g., values that result in reading improved representations of data and reliability information from a memory) based on the estimated memory error model 822. The decode parameter adjuster 809 may be configured to adjust a decode parameter (e.g., the generate adjusted ECC input data 828) based on the estimated memory error model 822. For example, the decode parameter adjuster 809 may determine LLR values based on the estimated memory error model 824 using Equation 8 or Equation 12. The adjusted read parameters 826 may be provided to a memory (e.g., the memory 104 of FIG. 1) and the adjusted ECC input data 828 may be provided to an ECC engine (e.g., the ECC engine 168 of FIG. 1).

The parameter adjuster 800 may improve reading operations performed at a memory and decoding performed by an ECC engine. For example, the parameter adjuster 800 may use an estimated memory error model to select LLR data that more accurately reflects the actual errors in a representation of the data or to select a read threshold that improves reading operations based on a more accurate modeling of the memory. Because the estimated memory error model more closely represents the actual errors in the data, the adjusted parameters generated by the parameter adjuster 800 may provide improvements to decoding and reading operations as compared to the adjustments described with reference to FIGS. 1-7.

Figure 9:
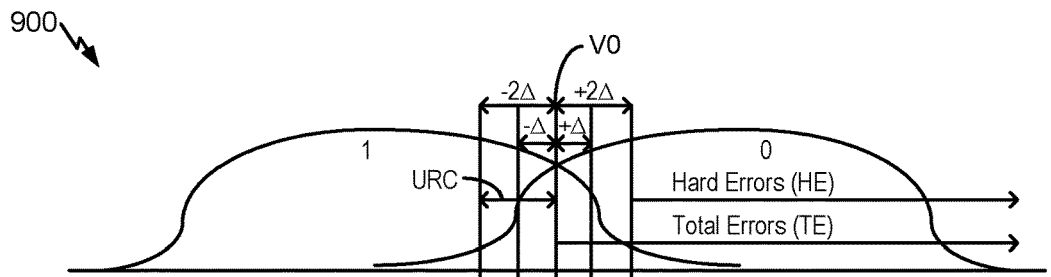
FIG. 9 illustrates an illustrative example of a voltage histogram correlated with a memory error model.
Figure 9:
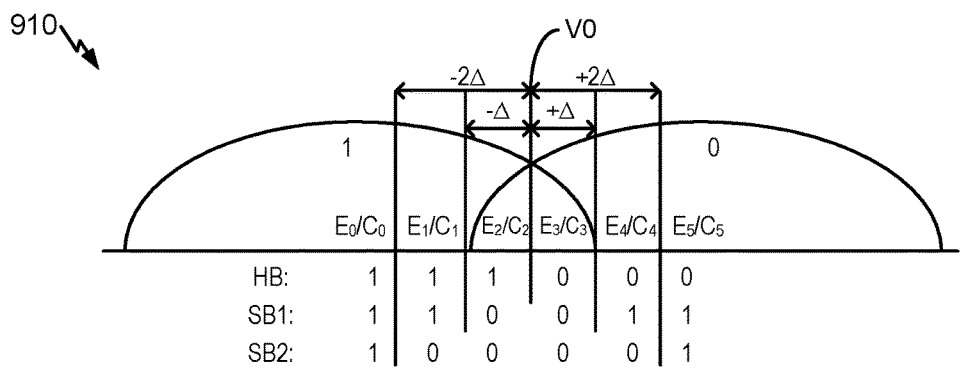
Figure 9:
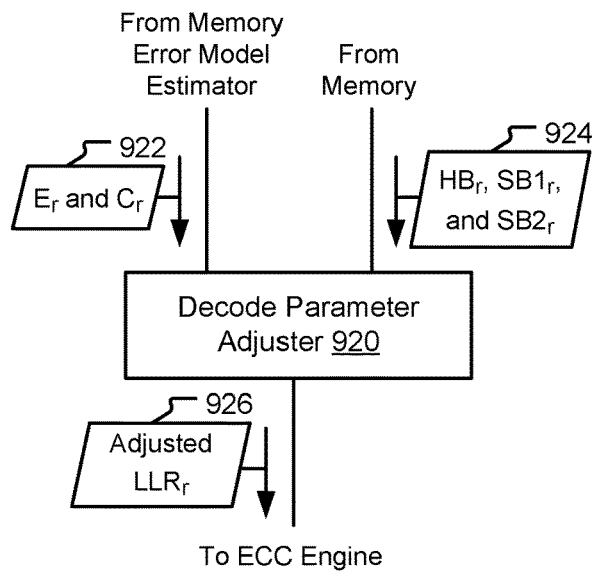

Referring to FIG. 9, a correlation between a voltage histogram and a memory error model is shown. FIG. 9 illustrates a first histogram 900 that may correspond to threshold voltages that can be programmed at a memory. In the first histogram 900, each abscissa indicates threshold voltages of storage elements of the memory, and each ordinate indicates a number of storage elements of the memory having a particular threshold voltage. The storage elements may correspond to the one or more storage elements 106 of FIG. 1, and the memory may correspond to the memory 104 of FIG. 1.

The first histogram 900 includes a "1" state distribution and a "0" state distribution. The first histogram 900 is an illustrative example of a histogram, and in other examples the first histogram 900 may include more than two state distributions. The threshold voltages can be sensed by applying one or more read thresholds (e.g., read voltages) to storage elements of the memory, such as a read threshold V0.

Additionally, soft bits may be sensed by applying one or more other read voltages that differ from the read threshold V0. The soft bit read voltages may be defined by a soft bit delta value. For example, soft bits of the first soft bit page SB1 may indicate storage elements having threshold voltages within a range between V0−Δ and V0+Δ, and soft bits of the second soft bit page SB2 may indicate storage elements having threshold voltages with a range between V0−2Δ and V0+2Δ. As illustrated in FIG. 9, for storage elements that are read with a hard bit value of "1", storage elements having threshold voltages between V0−2Δ and V0 are URC bits, storage elements having threshold voltages that exceed 2Δ are HEs, and storage elements having threshold voltages that exceed V0 are errors (e.g., contribute to the TE count).

FIG. 9 also illustrates a second histogram 910. The second histogram 910 includes a "1" state distribution and a "0" state distribution. The second histogram 910 is an illustrative example of a histogram, and in other examples the second histogram 910 may include more than two state distributions. Correlation of a memory error model and the second histogram 910 is illustrated. As described above, the memory error model is defined by a set of error counts corresponding to different "reliability bins" or "voltage bins." Each reliability bin or voltage bin may be determined by a combination of read hard bits and soft bits. For the second histogram 910, the voltage bins correspond to the following tuples of read values and reliability values <HB, SB1, SB2>: 111, 110, 100, 000, 010, and 011. Each error count $E_r$ and each bit count $C_r$ correspond to a tuple of read values and reliability values. For example, $E_0$ (the count of errors) and $C_0$ (the count of total bits) correspond to 111, $E_1$ and $C_1$ correspond to 110, $E_2$ and $C_2$ correspond to 100, $E_3$ and $C_3$ correspond to 000, $E_4$ and $C_4$ correspond to 010, and $E_5$ and $C_5$ correspond to 011.

The information of the memory error model (e.g., the error counts and the bit counts) may be correlated with the counts of errors and counts of bits described with reference to the first histogram 900. For example, the TEs=$E_0$+$E_1$+$E_2$+$E_3$+$E_4$+$E_5$, the HEs=$E_0$+$E_5$, and the URC bit count=$C_1$+$C_2$+$C_3$+$C_4$−$E_1$−$E_2$−$E_3$−$E_4$.

As described with reference to FIG. 8, an adjusted decode parameter, such as an adjusted LLR value, may be determined based on the estimated memory error model and the read values and reliability information. For example, a decode parameter adjuster 920 may receive estimated error model information 922 (e.g., an error count $E_r$ and a bit count $C_r$) from a memory error model estimator, and the decode parameter adjuster 920 may receive read values 924 (e.g., a hard bit value $HB_r$, a first soft bit value $SB1_r$, and a second soft bit value $SB2_r$) from a memory. The decode parameter adjuster 920 may determine an adjusted LLR value 926 (e.g., $LLR_r$) based on the estimated error model information 922 and the read values 924. In a particular implementation, the decode parameter adjuster 920 may determine the adjusted LLR value 926 using Equation 8. In other implementations, LLR values that correspond to different memory error models (e.g., different values of $E_r$ and $C_r$) may be precomputed and stored in a memory, and the adjusted LLR value 926 may be determined by retrieving an LLR value that corresponds to the estimated error model information 922 and the read values 924.

Figure 10:
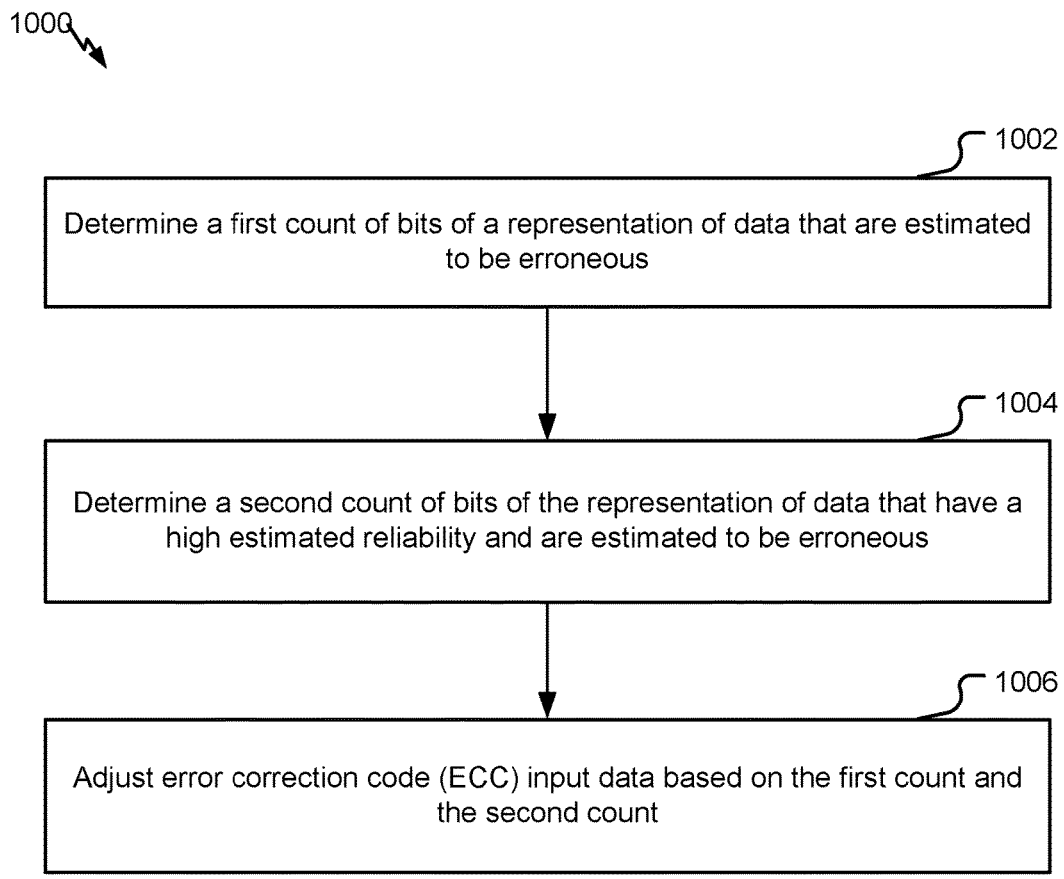
FIG. 10 is a flow diagram that illustrates an example of a method of adjusting ECC input data based on error counts.

Referring to FIG. 10, a particular illustrative example of a method 1000 of adjusting ECC input data based on error counts is shown. The method 1000 may be performed at a controller of a device, such as the data storage device 102 of FIG. 1.

The method 1000 includes determining a first count of bits of a representation of data that are estimated to be erroneous, at 1002. For example, the ECC input adjuster 162 may determine a first count of bits of the representation of data 140 that are estimated to be erroneous. The first count may include or correspond to the TE count 320 of FIG. 3, the first TE count 430 of FIG. 4, or the TE count 520 of FIG. 5.

The method 1000 includes determining a second count of bits of the representation of data that have a high estimated reliability and are estimated to be erroneous, at 1004. For example, the ECC input adjuster 162 may determine a second count of bits of the representation of data 140 that are estimated to be erroneous based on a bitwise syndrome vector and that have a high reliability based on the reliability information 142 received from the memory 104. The second count may include or correspond to the HE count 322 of FIG. 3, the first HE count 432 of FIG. 4, or the HE count 522 of FIG. 5.

The method 1000 includes adjusting error correction code (ECC) input data based on the first count and the second count, at 1006. For example, the ECC input adjuster 162 may adjust ECC input data to generate the adjusted ECC input data 170. The ECC input data may include LLR data indicative of LLR tables to map bit values to LLR values, LLR conversion data to calculate LLR values based on bit values, or adjusted soft bit values to be converted to LLR values, as illustrative, non-limiting examples.

In a particular implementation, the method 1000 further includes receiving, from a memory, the representation of data and reliability information associated with the representation of data. The first count and the second count may be determined based on the representation of data and the reliability information. To illustrate, the ECC input adjuster 162 may receive the representation of data 140 and the reliability information 142 from the memory 104. The method 1000 may also include determining log likelihood ratio (LLR) data based on the first count and the second count. The ECC input data may include the LLR data. In a particular implementation, determining the LLR data includes selecting the LLR data from a plurality of sets of LLR data based on the first count and the second count. For example, the ECC input adjuster 162 of FIG. 1 may select the first LLR data 164 if the first LLR data 164 corresponds to values that match the first count (e.g., the TE count) and the second count (e.g., the HE count). In another particular implementation, determining the LLR data includes computing the LLR data based on the first count and the second count. For example, the ECC input adjuster 162 of FIG. 1 may compute the LLR data based on the first count (e.g., the TE count) and the second count (e.g., the HE count) using Equation 6.

In another particular implementation, the method 1000 includes determining a third count of bits of the representation of data that have a low estimated reliability and are estimated to be correct. For example, the third count of bits may include or correspond to the URC bit count 324 of FIG. 3, the first URC bit count 434 of FIG. 4, or the URC bit count 524 of FIG. 5. Adjusting the ECC input data may be further based on the third count. The method 1000 may further include determining, based on the representation of data and the reliability information, a bitwise syndrome vector associated with the representation of data. For example, the bitwise syndrome vector may include or correspond to the bitwise syndrome vector 214 of FIG. 2. The first count, the second count, and the third count may be determined based on the bitwise syndrome vector and the reliability information, as further described with reference to FIG. 2.

In another particular implementation, the method 1000 includes determining a fourth count of bits of a second group of bits of the representation of data that are estimated to be erroneous, determining a fifth count of bits of the second group of bits that have a high estimated reliability and are estimated to be erroneous, and adjusting second ECC input data based on the fourth count and the fifth count. For example, the fourth count of bits may include the second TE count 436 of FIG. 4, the fifth count of bits may include or correspond to the second HE count 438 of FIG. 4, and the second ECC input data may include the second group adjusted ECC input data 448.

In another particular implementation, the reliability information includes soft bit values, and modifying the ECC input data includes modifying one or more of the soft bit values based on the first count and the second count. For example, the soft bit values may include or correspond to the first soft bits 144 and the Kth soft bits 146 of FIG. 1. The method 1000 may include determining a bitwise syndrome vector based on the representation of data and the reliability information and modifying a first soft bit value of the soft bit values in response to determining that a corresponding bit of the bitwise syndrome vector is greater than or equal to a first threshold. For example, the bitwise syndrome vector may include or correspond to the bitwise syndrome vector 214 of FIG. 2. In this implementation, a first soft bit (e.g., of the first soft bits 144 or the Kth soft bits 146) may be modified in response to determining that a corresponding bit of the bitwise syndrome vector is greater than or equal to a threshold, and the modified soft bit value may be included in the adjusted ECC input data 170. The method 1000 may further include modifying a second soft bit value of the soft bit values in response to determining that a corresponding bit of the bitwise syndrome vector is less than or equal to a second threshold. For example, soft bit values may be modified based on corresponding values of the bitwise syndrome vector, as further described with reference to FIG. 5.

The method 1000 may improve decoding performed by an ECC engine. For example, because the ECC input data is adjusted based on one or more error counts (e.g., the first count and the second count), the adjusted ECC input data may more accurately reflect the actual errors in a representation of the data than static ECC data (e.g., static LLR data or unadjusted soft bits). ECC input data that more accurately reflects the actual errors in the representation of data improves performance of the ECC engine when decoding the representation of data. For example, the ECC engine may use the adjusted ECC input data (e.g., determined LLR data or adjusted soft bits) to decode the representation of data faster, and with reduced power consumption, as compared to decoding the representation of data using static ECC input data.

Figure 11:
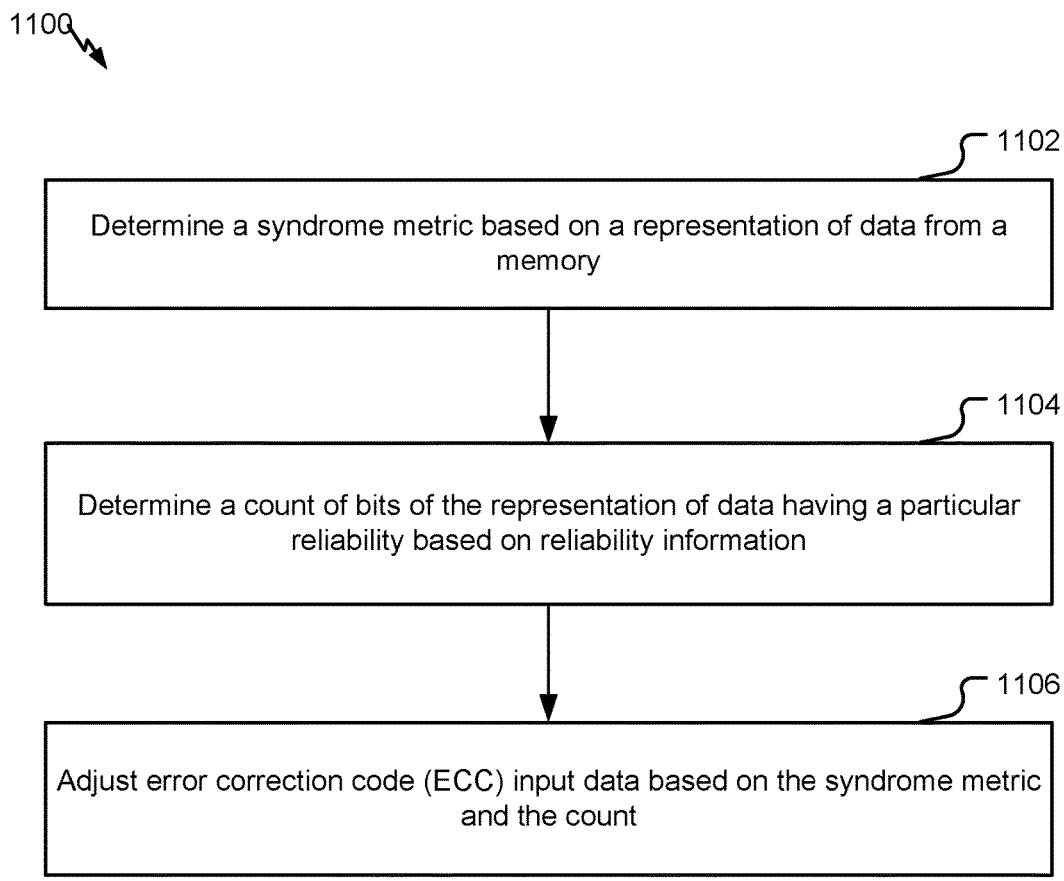
FIG. 11 is a flow diagram that illustrates an example of a method of adjusting ECC input data based on a syndrome metric and an error count.

Referring to FIG. 11, a particular illustrative example of a method 1100 of adjusting ECC input data based on a syndrome metric and an error count is shown. The method 1100 may be performed at a controller of a device, such as the data storage device 102 of FIG. 1.

The method 1100 includes determining a syndrome metric based on a representation of data from a memory, at 1102. For example, the ECC input adjuster 162 may determine a syndrome metric based on the representation of data 140 received from the memory 104. The syndrome metric may include or correspond to the syndrome metric 620 of FIG. 6.

In a particular implementation, the syndrome metric includes a syndrome weight. For example, the syndrome metric may include or correspond to the syndrome weight 210 of FIG. 2. In another particular implementation, the syndrome metric includes a generalized syndrome weight. For example, the syndrome metric may include or correspond to the generalized syndrome weight 212 of FIG. 2.

The method 1100 includes determining a count of bits of the representation of data having a particular reliability based on reliability information, at 1104. For example, the ECC input adjuster 162 may determine a count of bits of the representation of data 140 that are estimated to be erroneous based on the reliability information 142. The count may include or correspond to the count 622 of soft bits of FIG. 6, and the reliability information may include or correspond to the reliability information 142 of FIG. 1 or the reliability information 612 of FIG. 6.

The method 1100 includes adjusting error correction code (ECC) input data based on the syndrome metric and the count, at 1106. For example, the ECC input adjuster 162 may adjust ECC input data to generate the adjusted ECC input data 170. In a particular implementation, adjusting the ECC input data includes selecting log likelihood ratio (LLR) data based on the syndrome metric and the count, and the ECC input data includes the LLR data. For example, the LLR data may include or correspond to the first LLR data 164 or the Nth LLR data 166 of FIG. 1.

The method 1100 may improve decoding performed by an ECC engine. For example, because the ECC input data is adjusted based on a syndrome metric and a count of bits having a particular reliability, the adjusted ECC input data may more accurately reflect the actual errors in a representation of the data than static ECC data (e.g., static LLR data or unadjusted soft bits). ECC input data that more accurately reflects the actual errors in the representation of data improves performance of the ECC engine when decoding the representation of data. For example, the ECC engine may use the adjusted ECC input data (e.g., determined LLR data or adjusted soft bits) to decode the representation of data faster, and with reduced power consumption, as compared to decoding the representation of data using static ECC input data.

Figure 12:
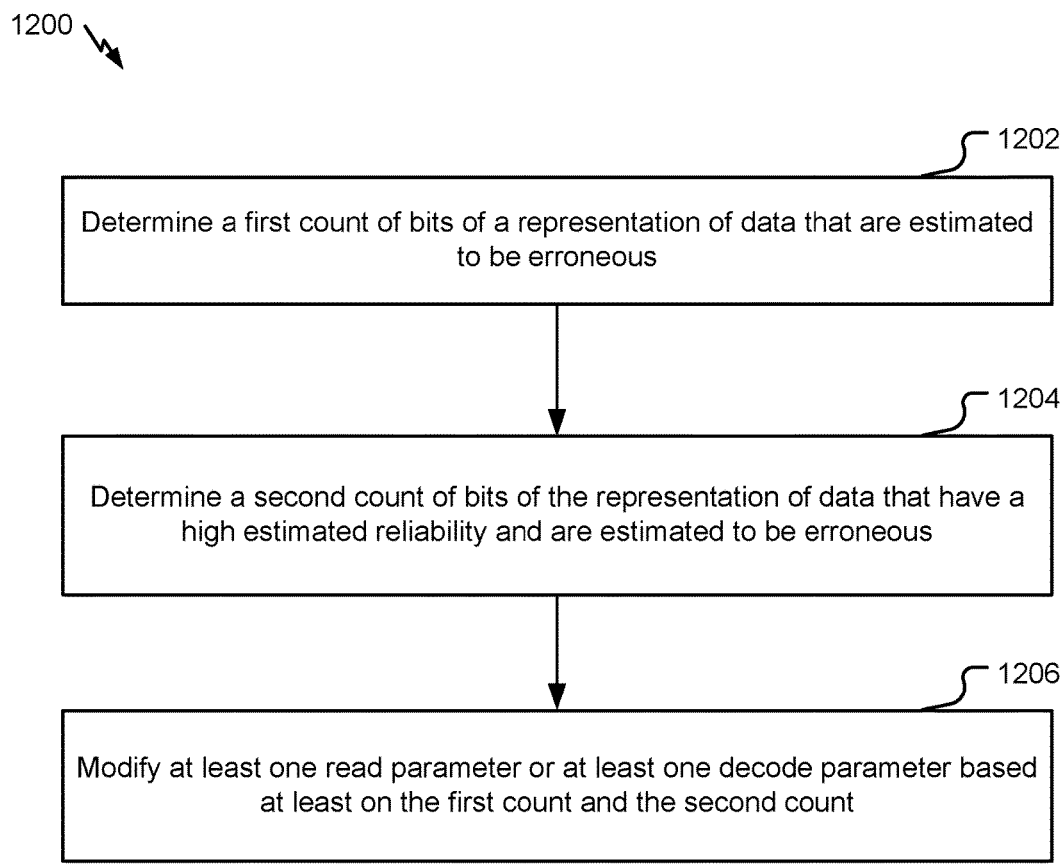
FIG. 12 is a flow diagram that illustrates an example of a method of adjusting a read parameter or a decode parameter based on error counts.

Referring to FIG. 12, a particular illustrative example of a method 1200 of modifying at least one read parameter or at least one decode parameter based on error counts is shown. The method 1200 may be performed at a controller of a device, such as the data storage device 102 of FIG. 1.

The method 1200 includes determining a first count of bits of a representation of data that are estimated to be erroneous, at 1202. For example, the ECC input adjuster 162 or the read parameter adjuster 161 may determine a first count of bits of the representation of data 140 that are estimated to be erroneous. The first count may include or correspond to the TE count 320 of FIG. 3, the first TE count 430 of FIG. 4, the TE count 520 of FIG. 5, or the TE count 730 of FIG. 7.

The method 1200 includes determining a second count of bits of the representation of data that have a high estimated reliability and are estimated to be erroneous, at 1204. For example, the read parameter adjuster 161 or the ECC input adjuster 162 may determine a second count of bits of the representation of data 140 that are estimated to be erroneous based on a bitwise syndrome vector and that have a high reliability based on the reliability information 142 received from the memory 104. The second count may include or correspond to the HE count 322 of FIG. 3, the first HE count 432 of FIG. 4, the HE count 522 of FIG. 5, or the HE count 732 of FIG. 7.

The method 1200 includes modifying at least one read parameter or at least one decode parameter based at least on the first count and the second count, at 1206. For example, the ECC input adjuster 162 may adjust ECC input data (e.g., modify the decode parameter 167) to generate the adjusted ECC input data 170. Additionally or alternatively, the read parameter adjuster 161 may modify the read parameter 163 to generate the adjusted read parameter 165.

In a particular implementation, the method 1200 includes initiating a read operation at memory using the at least one modified read parameter. The at least one modified read parameter may include at least one modified read threshold, at least one modified soft bit delta value, or a combination thereof. For example, the read/write circuitry 111 of FIG. 1 may initiate a subsequent read operation at the address associated with the representation of data 140 using the modified read parameter 165.

In another particular implementation, the method 1200 includes decoding the representation of the data using the at least one modified decode parameter. The at least one modified decode parameter may include at least one modified log likelihood ratio (LLR) value, at least one modified soft bit value, or a combination thereof. For example, the representation of data may include or correspond to the representation of data 140, and the adjusted ECC input data 170 (that is indicative of the modified decode parameter) may be decoded by the ECC engine 168.

In another particular implementation, the method 1200 includes determining a syndrome metric based on the representation of data, determining a count of bits of the representation of data having a particular reliability based on reliability information associated with the representation of data, and modifying a second decode parameter based on the syndrome metric and the count. For example, the syndrome metric may include or correspond to the syndrome metric 620, the count of bits may include or correspond to the count 622, and the modified second decode parameter may include or correspond to the adjusted ECC input data 630 of FIG. 6. The syndrome metric may include a syndrome weight, and a bit of the representation of data may have the particular reliability if a corresponding bit of the reliability information has a particular value associated with high reliability. Alternatively, the syndrome metric may include a generalized syndrome weight, and a bit of the representation of data may have the particular reliability if a corresponding bit of the reliability information has a particular value associated with high reliability.

In another particular implementation, the method 1200 includes determining a fourth count of bits of a second group of bits of the representation of data that are estimated to be erroneous, determining a fifth count of bits of the second group of bits that have a high estimated reliability and are estimated to be erroneous, and modifying a second decode parameter based on the fourth count and the fifth count. For example, the fourth count of bits may include or correspond to the second TE count 436, the fifth count of bits may include or correspond to the second HE count 438, and the modified second parameter may be indicated by the second group adjusted ECC input data 448 of FIG. 4. The first count of bits and the second count of bits and the at least one decode parameter may be associated with a first group of bits of the representation of data, and the second decode parameter may be associated with the second group of bits.

The method 1200 may improve decoding performed by an ECC engine. For example, because the decode parameter (e.g., the ECC input data) is adjusted based on one or more error counts (e.g., the first count and the second count), the adjusted ECC input data may more accurately reflect the actual errors in a representation of the data than static ECC data (e.g., static decode parameters, such as static LLR data or unadjusted soft bits). ECC input data that more accurately reflects the actual errors in the representation of data improves performance of the ECC engine when decoding the representation of data. For example, the ECC engine may use the adjusted ECC input data (e.g., determined LLR data or adjusted soft bits) to decode the representation of data faster, and with reduced power consumption, as compared to decoding the representation of data using static ECC input data. Additionally, performing a subsequent read of a group of storage elements using the adjusted read parameter results in a new representation of data with fewer errors or that is more reliable. The ECC engine may decode the new representation of data faster, and with reduced power consumption, as compared to data resulting from a subsequent read operation that uses a static read parameter.

The method 1000 of FIG. 10, the method 1100 of FIG. 11, the method 1200 of FIG. 12, or a combination thereof, may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 1000 of FIG. 10, the method 1100 of FIG. 11, the method 1200 of FIG. 12, or a combination thereof, can be initiated or controlled by one or more processors, such as one or more processors included in or coupled to a controller or a memory of the data storage device 102 and/or the access device 150 of FIG. 1. As an example, the method 1000 of FIG. 10, the method 1100 of FIG. 11, the method 1200 of FIG. 12, or a combination thereof, individually or in combination, may be performed by the controller 120 of FIG. 1. To illustrate, a portion of the method 1000 of FIG. 10, a portion of the method 1100 of FIG. 11, or a portion of the method 1200 of FIG. 12 may be combined with other operations described herein. Additionally, one or more operations described with reference to FIGS. 10-12 may be optional, may be performed at least partially concurrently, and/or may be performed in a different order than shown or described.

In an illustrative example, a processor may be programmed to determine a first count of bits of a representation of data that are estimated to be erroneous and a second count of bits of the representation of data that have high estimated reliability and that are estimated to be erroneous. For example, the processor may execute instructions to determine a first count (e.g., a total count) of bits of a representation of data that are estimated to be erroneous, regardless of estimated reliability, and to determine a second count of bits of the representation of data that have high estimated reliability and are estimated to be erroneous. The processor may further execute instructions to adjust ECC input data based on the first count and the second count.

In another illustrative example, a processor may be programmed to determine a syndrome metric based on a representation of data from the memory and to determine a count of bits of the representation of data having a particular reliability based on the reliability information. For example, the processor may execute instructions to determine a syndrome metric (e.g., a syndrome weight or a generalized syndrome weight) based on a representation of data, and to determine a count of bits of the representation of data having a particular reliability level (e.g., a corresponding soft bit having a particular value) based on one or more soft bits. The processor may further execute instructions to adjust ECC input data based on the syndrome metric and the count.

In another illustrative example, a processor may be programmed to determine a first count of bits of a representation of data that are estimated to be erroneous and a second count of bits of the representation of data that have high estimated reliability and that are estimated to be erroneous. For example, the processor may execute instructions to determine a first count (e.g., a total count) of bits of a representation of data that are estimated to be erroneous, regardless of estimated reliability, and to determine a second count of bits of the representation of data that have high estimated reliability and are estimated to be erroneous. The processor may further execute instructions to modify at least one read parameter or at least one decode parameter based at least on the first count and the second count.

Figure 13:
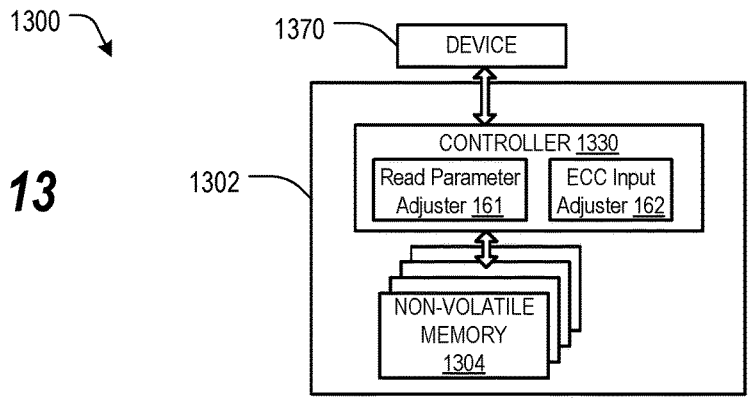
FIG. 13 is a block diagram of a particular illustrative implementation of a non-volatile memory system.

Referring to FIG. 13, a system 1300 includes a non-volatile memory system 1302 (e.g., the data storage device 102) that may be coupled to a device 1370 (e.g., the access device 150). The non-volatile memory system 1302 includes a controller 1330 (e.g., the controller 120) and non-volatile memory that may be made up of one or more non-volatile memory dies 1304 (e.g., one or more memory dies included in the memory 104). As used herein, the term "memory die" refers to the collection of non-volatile memory cells, and associated circuitry for managing the physical operation of those non-volatile memory cells, that are formed on a single semiconductor substrate. The controller 1330 interfaces with the device 1370 and transmits command sequences for read, program, and erase operations to the one or more non-volatile memory dies 1304. The controller 1330 includes the ECC input adjuster 162.

The controller 1330 (which may be a flash memory controller) may take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 1330 may be configured with hardware and/or firmware to perform the various functions described above and shown in the flow diagrams. Also, some of the components shown as being internal to the controller 1330 can be stored external to the controller 1330, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory, map out bad flash memory cells, and allocate spare cells to be substituted for future failed cells. Some part of the spare cells can be used to hold firmware to operate the flash memory controller and implement other features. In operation, when a host device is to read data from or write data to the flash memory, the host device communicates with the flash memory controller. If the host device provides a logical address to which data is to be read/written, the flash memory controller can convert the logical address received from the host device to a physical address in the flash memory. (Alternatively, the host device can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The one or more non-volatile memory dies 1304 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between the controller 1330 and the one or more non-volatile memory dies 1304 may be any suitable flash interface, such as Toggle Mode 200, 400, or 800. In one implementation, the non-volatile memory system 1302 may be a card based system, such as a secure digital (SD) or a micro secure digital (micro-SD) card. In an alternate implementation, the non-volatile memory system 1302 may be part of an embedded memory system.

Although, in the example illustrated in FIG. 13, the non-volatile memory system 1302 (sometimes referred to herein as a storage module) includes a single channel between the controller 1330 and the one or more non-volatile memory dies 1304, the subject matter described herein is not limited to having a single memory channel. For example, in some NAND memory system architectures, 2, 4, 8 or more NAND channels may exist between the controller 1330 and the NAND memory device, depending on controller capabilities. In any of the embodiments described herein, more than a single channel may exist between the controller 1330 and the one or more non-volatile memory dies 1304, even if a single channel is shown in the drawings.

Figure 14:
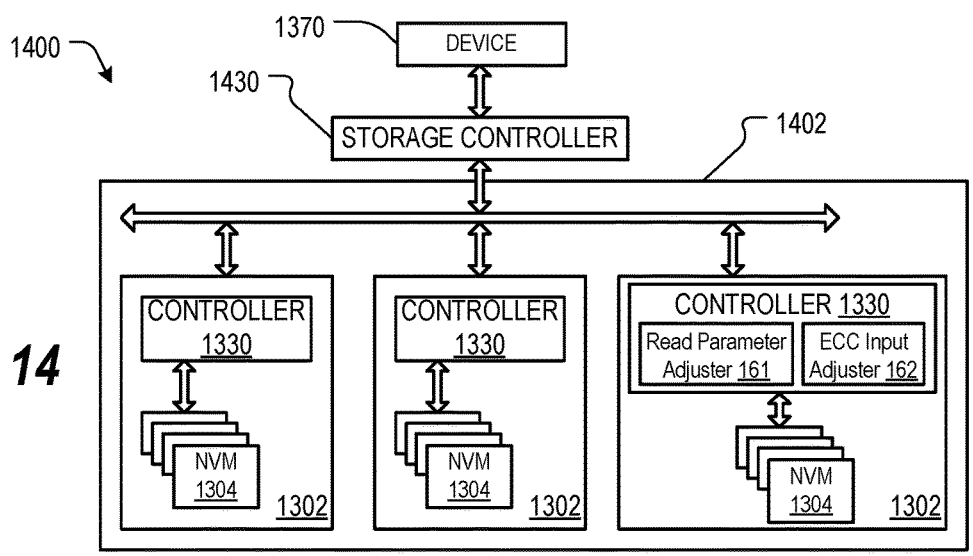
FIG. 14 is a block diagram of a particular illustrative implementation of a storage module including a plurality of the non-volatile memory systems of FIG. 13.

FIG. 14 illustrates a storage system 1400 that includes multiple non-volatile memory systems 1302. As such, storage system 1400 may include a storage controller 1430 that interfaces with the device 1370 (e.g., a host device) and with a storage system 1402, which includes a plurality of non-volatile memory systems 1302. The interface between the storage controller 1430 and the non-volatile memory systems 1302 may be a bus interface, such as a serial advanced technology attachment (SATA) or peripheral component interface express (PCIe) interface. The storage system 1400 may correspond to a solid state drive (SSD), such as found in portable computing devices, such as laptop computers, and tablet computers. One or more of the controllers 1330 of FIG. 14 may include the ECC input adjuster 162. The storage controller 1430 may include the ECC input adjuster 162.

Figure 15:
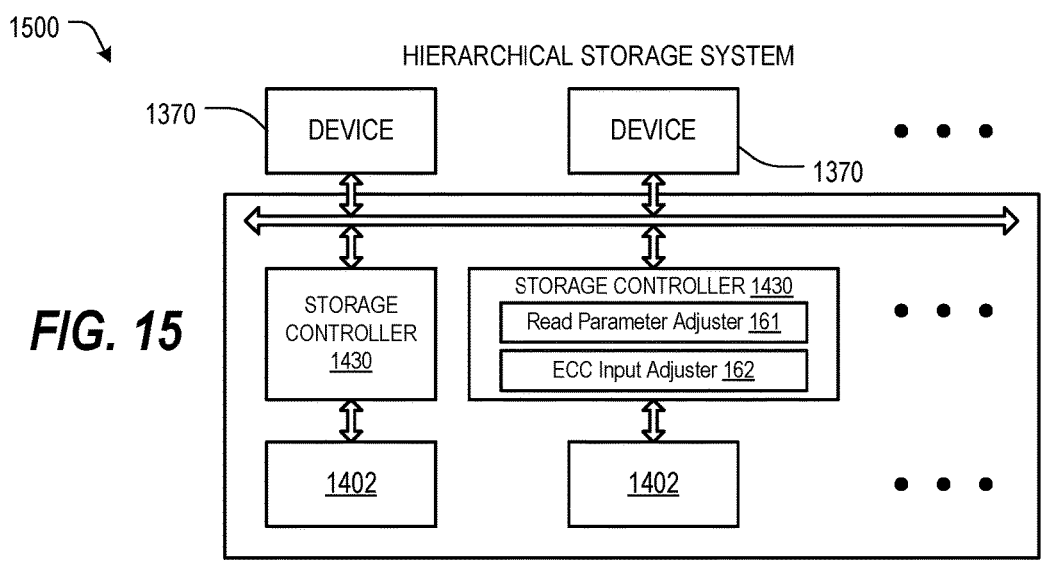
FIG. 15 is a block diagram of a particular illustrative implementation of a hierarchical storage system.

FIG. 15 is a block diagram illustrating a hierarchical storage system 1500. The hierarchical storage system 1500 includes a plurality of storage controllers 1430, each of which controls a respective storage system 1402. Devices 1370 (e.g., one or more host devices or accessing devices) may access memories within the hierarchical storage system 1500 via a bus interface. In one implementation, the bus interface may be an NVMe or fiber channel over Ethernet (FCoE) interface. In one implementation, the hierarchical storage system 1500 illustrated in FIG. 15 may be a rack mountable mass storage system that is accessible by multiple host computers, such as would be found in a data center or other location where mass storage is needed. One or more storage controllers 1430 of FIG. 15 may include the ECC input adjuster 162.

Figure 16:
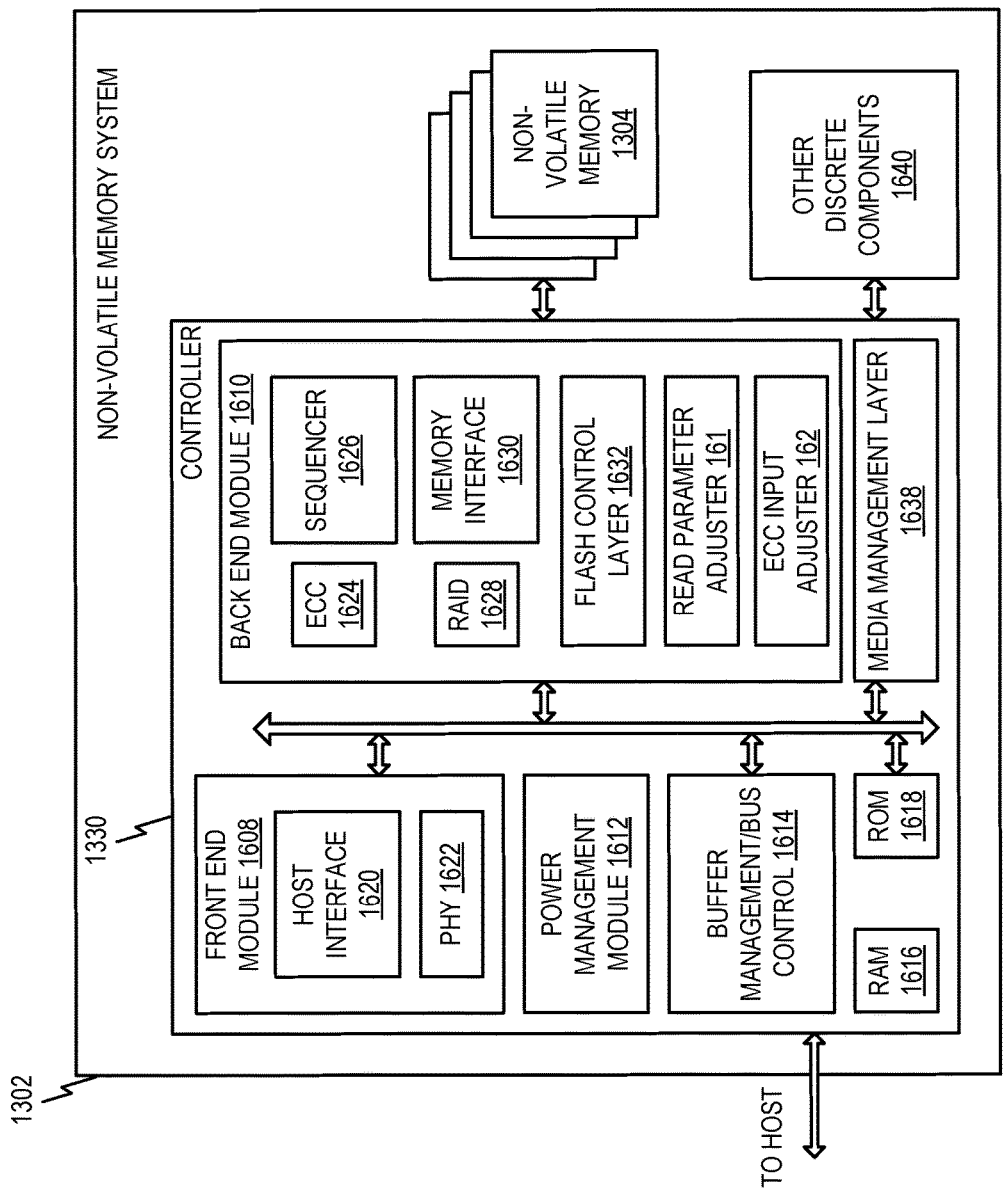
FIG. 16 is a block diagram of components of a particular illustrative implementation of a controller.

FIG. 16 is a block diagram illustrating exemplary components of the controller 1330 of the non-volatile memory system 1302 in more detail. The controller 1330 may include the ECC input adjuster 162. The controller 1330 also includes a front end component 1608 that interfaces with a host device, a back end component 1610 that interfaces with the one or more non-volatile memory dies 1304, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to the controller 1330, a buffer manager/bus controller 1614 manages buffers in random access memory (RAM) 1616 and controls the internal bus arbitration of the controller 1330. A read only memory (ROM) 1618 stores system boot code. Although illustrated in FIG. 16 as located within the controller 1330, in other embodiments one or both of the RAM 1616 and the ROM 1618 may be located externally to the controller 1330. In yet other embodiments, portions of RAM and ROM may be located both within the controller 1330 and outside the controller 1330.

Front end component 1608 includes a host interface 1620 and a physical layer interface (PHY) 1622 that provide the electrical interface with the host device or next level storage controller. The choice of the type of host interface 1620 can depend on the type of memory being used. Examples of host interfaces 1620 include, but are not limited to, SATA, SATA Express, SAS, Fibre Channel, USB, PCIe, and NVMe. The host interface 1620 typically facilitates transfer for data, control signals, and timing signals.

Back end component 1610 includes an error correcting code (ECC) engine 1624 that encodes the data received from the host device, and decodes and error corrects the data read from the non-volatile memory. A command sequencer 1626 generates command sequences, such as program and erase command sequences, to be transmitted to the one or more non-volatile memory dies 1304. A RAID (Redundant Array of Independent Drives) component 1628 manages generation of RAID parity and recovery of failed data. The RAID parity may be used as an additional level of integrity protection for the data being written into the one or more non-volatile memory dies 1304. In some cases, the RAID component 1628 may be a part of the ECC engine 1624. A memory interface 1630 provides the command sequences to the non-volatile memory dies 1304 and receives status information from the one or more non-volatile memory dies 1304. For example, the memory interface 1630 may be a double data rate (DDR) interface, such as a Toggle Mode 200, 400, or 800 interface. A flash control layer 1632 controls the overall operation of back end component 1610.

Additional components of the non-volatile memory system 1302 illustrated in FIG. 16 include a power management component 1612 and a media management layer 1638, which performs wear leveling of memory cells of the one or more non-volatile memory dies 1304. The non-volatile memory system 1302 may also include one or more other components or features illustrated with reference to FIG. 1, such as the ECC input adjuster 162, as an illustrative example. Non-volatile memory system 1302 also includes other discrete components 1640, such as external electrical interfaces, external RAM, resistors, capacitors, or other components that may interface with the controller 1330. In alternative embodiments, one or more of the physical layer interface 1622, RAID component 1628, media management layer 1638 and buffer management/bus controller 1614 are optional components that are omitted from the controller 1330.

Figure 17:
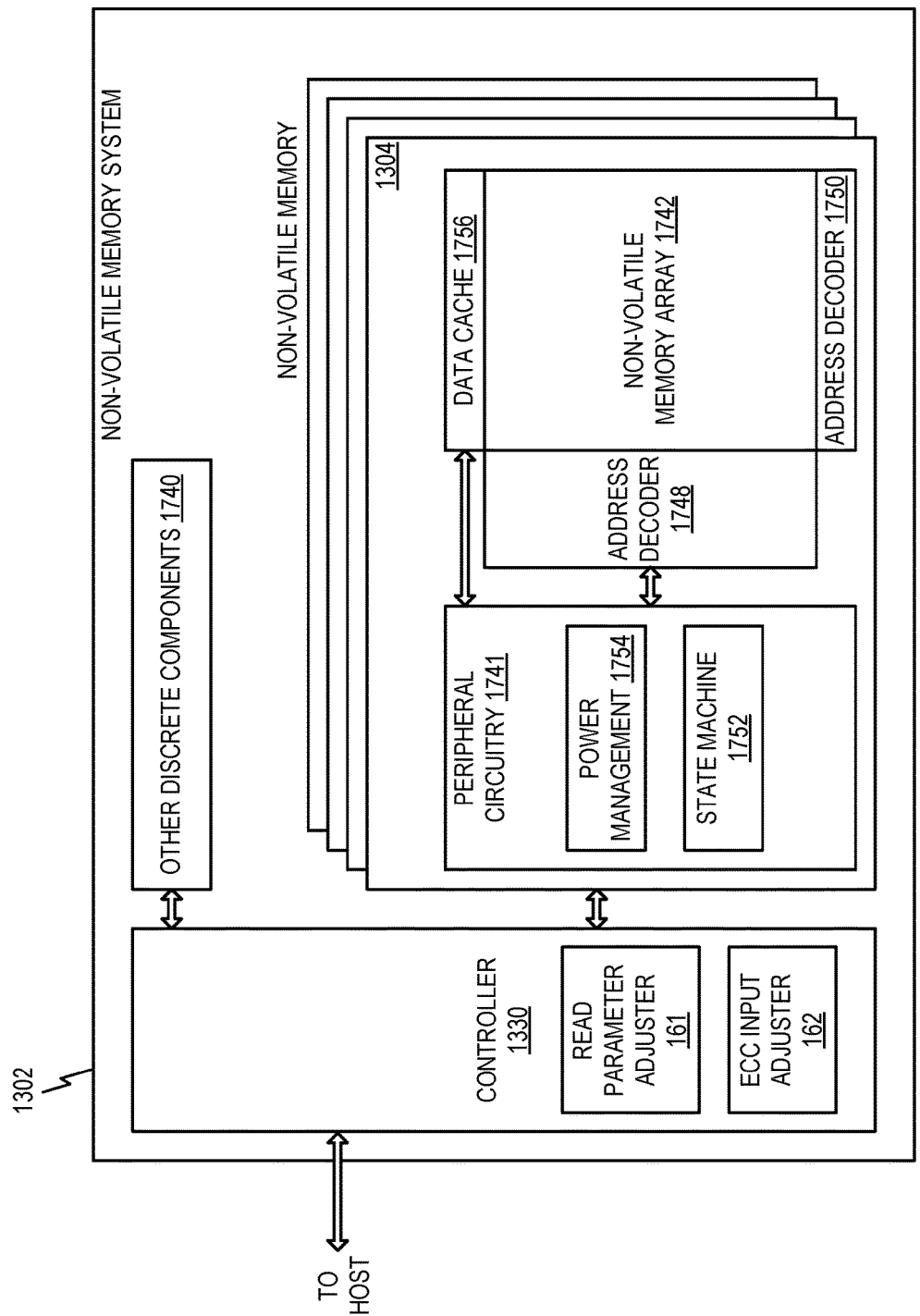
FIG. 17 is a block diagram of components of a particular illustrative implementation of a non-volatile memory die.

FIG. 17 is a block diagram illustrating exemplary components of the one or more non-volatile memory dies 1304 of the non-volatile memory system 1302 in more detail. The one or more non-volatile memory dies 1304 include peripheral circuitry 1741 and a non-volatile memory array 1742. The non-volatile memory array 1742 includes the non-volatile memory cells used to store data. The non-volatile memory cells may be any suitable non-volatile memory cells, including NAND flash memory cells and/or NOR flash memory cells in a two dimensional and/or three dimensional configuration. The peripheral circuitry 1741 includes a state machine 1752 that provides status information to the controller 1330. The peripheral circuitry 1741 may also include a power management or data latch control component 1754. The one or more non-volatile memory dies 1304 further include discrete components 1740, an address decoder 1748, an address decoder 1750, and a data cache 1756 that caches data. FIG. 17 also illustrates that the controller 1330 may include the ECC input adjuster 162.

Although various components of the data storage device 102 and/or the access device 150 of FIG. 1 are depicted herein as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of the method 1000 of FIG. 10, the method 1100 of FIG. 11, or the method 1200 of FIG. 12. In a particular implementation, each of the controller 120, the memory 104, and/or the access device 150 of FIG. 1 includes a processor executing instructions that are stored at a memory, such as a non-volatile memory of the data storage device 102 or the access device 150 of FIG. 1. Alternatively or additionally, executable instructions that are executed by the processor may be stored at a separate memory location that is not part of the non-volatile memory, such as at a read-only memory (ROM) of the data storage device 102 or the access device 150 of FIG. 1.

In a particular implementation, an apparatus includes means for storing data. For example, the means for storing may include the memory 104 of FIG. 1, the non-volatile memory dies 1304 of FIGS. 13, 14, 16, and 17, one or more other devices, circuits, modules, or instructions to store data, or a combination thereof.

The apparatus further includes means for modifying at least one read parameter or at least one decode parameter based on a first count of bits of a representation of data that are estimated to be erroneous and a second count of bits of the representation of data that have high estimated reliability and are estimated to be erroneous. For example, the means for modifying may include the controller 120 of FIG. 1, the read parameter adjuster 161 of FIGS. 1 and 13-17, the ECC input adjuster 162 of FIGS. 1 and 13-17, the ECC input adjuster 300 of FIG. 3, the ECC input adjuster 400 of FIG. 4, the ECC input adjuster 500 of FIG. 5, the ECC input adjuster 600 of FIG. 6, the read parameter adjuster 700 of FIG. 7, one or more other devices, circuits, modules, or instructions to modify at least one read parameter or at least one decode parameter based on the first count of bits and the second count of bits, or a combination thereof.

The apparatus may further include means for decoding the representation of data using the modified at least one decode parameter. For example, the means for decoding may include the controller 120 or the ECC engine 168 of FIG. 1, the ECC engine 1624 of FIG. 16, one or more other devices, circuits, modules, or instructions to decode a representation of data using a modified at least one decode parameter, or a combination thereof. The modified at least one decode parameter may include one or more LLR values, one or more soft bit values, or a combination thereof.

The apparatus may further include means for reading a second representation of data from the means for storing using the modified at least one read parameter. For example, the means for reading may include the controller 120, the memory interface 122, or the read/write circuitry 111 of FIG. 1, the memory interface 1630 of FIG. 16, one or more other devices, circuits, modules, or instructions to read a representation of data using a modified at least one read parameter, or a combination thereof. The representation of data and the second representation of data may correspond to the same location (e.g., the same address) at the means for storing, and the modified at least one read parameter may include one or more read thresholds, one or more soft bit delta values, or a combination thereof.

With reference to FIG. 1, in some implementations, the data storage device 102 may be embedded within the access device 150, such as in accordance with a Joint Electron Devices Engineering Council (JEDEC) Solid State Technology Association Universal Flash Storage (UFS) configuration. Alternatively, the data storage device 102 may be removable from the access device 150 (i.e., "removably" coupled to the access device 150). As an example, the data storage device 102 may be removably coupled to the access device 150 in accordance with a removable universal serial bus (USB) configuration. In some implementations, the data storage device 102 may include or correspond to a solid state drive (SSD) which may be included in, or distinct from (and accessible to), the access device 150. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 may be coupled to the access device 150 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be configured to be coupled to the access device 150 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 150 (e.g., "removably" coupled to the access device 150). As an example, the data storage device 102 may be removably coupled to the access device 150 in accordance with a removable universal serial bus (USB) configuration.

The data storage device 102 may operate in compliance with an industry specification. For example, the data storage device 102 may include a SSD and may be configured to communicate with the access device 150 using a small computer system interface (SCSI)-type protocol, such as a serial attached SCSI (SAS) protocol. As other examples, the data storage device 102 may be configured to communicate with the access device 150 using a NVM Express (NVMe) protocol or a serial advanced technology attachment (SATA) protocol. In other examples, the data storage device 102 may operate in compliance with a JEDEC eMMC specification, a JEDEC universal flash storage (UFS) specification, one or more other specifications, or a combination thereof, and may be configured to communicate using one or more protocols, such as an eMMC protocol, a UFS protocol, a USB protocol, and/or another protocol, as non-limiting examples.

In some implementations, the data storage device 102 and the access device 150 may be configured to communicate using one or more protocols, such as a SAS protocol, a SATA protocol, an NVMe protocol, an eMMC protocol, a UFS protocol, a USB protocol, and/or another protocol, as illustrative, non-limiting examples. The one or more protocols may include a standardized protocol and/or a non-standardized protocol, such as a proprietary protocol. As other examples, the access device 150 may operate in compliance with a JEDEC industry specification, such as a UFS Access Controller Interface specification. In some implementations, the data storage device 102 and the access device 150 may be configured to communicate using dual channel communication (e.g., both devices may issue and receive commands from the other device).

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
a memory; and
a controller coupled to the memory, wherein the controller is configured to
determine a first count of bits of a representation of data stored in the memory that are estimated to be erroneous,
determine a second count of bits of the representation of data that have high estimated reliability and are estimated to be erroneous, determine a third count of bits of the representation of data that have low estimated reliability and are estimated to be correct, and modify at least one read parameter used in a read operation at the memory or at least one decode parameter used in decoding the representation of data based on the first count, the second count, and the third count.

2. The device of claim 1, wherein the controller is further configured to receive, from the memory, the representation of data and reliability information associated with the representation of data, and wherein the first count and the second count are determined based on the representation of data and the reliability information.

3. The device of claim 1, wherein the at least one decode parameter comprises one or more log likelihood ratio (LLR) values, one or more soft bit values, or a combination thereof.

4. The device of claim 1, wherein the at least one read parameter comprises one or more read thresholds, one or more soft bit delta values, or a combination thereof, the one or more soft bit delta values comprising one or more voltage thresholds used to generate reliability information corresponding to the representation of the data.

5. The device of claim 1, wherein the controller is further configured to determine a fourth count of bits of the representation of data that have a low estimated reliability and are estimated to be incorrect, and a fifth count of bits of the representation of data that have a high estimated reliability and are estimated to be correct, and wherein the controller is configured to modify the at least one read parameter or the at least one decode parameter further based on the fourth count and the fifth count.

6. The device of claim 5, wherein the controller is further configured to determine, based on the representation of data and reliability information associated with the representation of data, a bitwise syndrome vector associated with the representation of data, wherein the first count, the second count, and the third count are based on the bitwise syndrome vector and the reliability information.

7. The device of claim 1, wherein the controller is further configured to estimate an error model based at least in part on one or more count values of bits of the representation of data, wherein each count value indicates to a count of bits having a corresponding combination of bit value and number of unsatisfied parity checks, and wherein the at least one decode parameter or the at least one read parameter is modified based on the error model.

8. The device of claim 7, wherein the controller is further configured to estimate the error model based on data corresponding to a linear regression model or data corresponding to one or more bit error rate values.

9. A method performed by a controller of a device, the method comprising:
determining a first count of bits of a representation of data stored in a memory of the device that are estimated to be erroneous;
determining a second count of bits of the representation of data that have a high estimated reliability and are estimated to be erroneous;
determining a third count of bits of the representation of data that have a low estimated reliability and are estimated to be correct; and
modifying at least one read parameter used in a read operation at the memory or at least one decode parameter used in decoding the representation of data based at least on the first count and the second count.

10. The method of claim 9, further comprising initiating a read operation at a memory using the at least one modified read parameter, wherein the at least one modified read parameter comprises at least one modified read threshold, at least one modified soft bit delta value, or a combination thereof.

11. The method of claim 9, further comprising decoding the representation of the data using the modified at least one decode parameter, wherein the modified at least one decode parameter comprises at least one modified log likelihood ratio (LLR) value, at least one modified soft bit value, or a combination thereof.

12. The method of claim 9, further comprising:
determining a syndrome metric based on the representation of data, wherein the syndrome metric includes a syndrome weight or a generalized syndrome weight;
determining a count of bits of the representation of data having a particular reliability based on reliability information associated with the representation of data, wherein a bit of the representation of data has the particular reliability if a corresponding bit of the reliability information has a particular value associated with high reliability; and
modifying a second decode parameter based on the syndrome metric and the count.

13. The method of claim 9, further comprising:
determining a fourth count of bits of a second group of bits of the representation of data that are estimated to be erroneous, wherein the first count of bits and the second count of bits are associated with a first group of bits of the representation of data;
determining a fifth count of bits of the second group of bits that have a high estimated reliability and are estimated to be erroneous; and
modifying a second decode parameter based on the fourth count and the fifth count, wherein the second decode parameter is associated with the second group of bits, and wherein the at least one decode parameter is associated with the first group of bits.

14. An apparatus comprising:
means for storing data; and
means for modifying at least one read parameter used in a read operation at the means for storing data or at least one decode parameter used in decoding a representation of data stored in the means for storing data based on
a first count of bits of the representation of data that are estimated to be erroneous,
a second count of bits of the representation of data that have high estimated reliability and are estimated to be erroneous, and
a third count of bits of the representation of data that have low estimated reliability and are estimated to be correct.

15. The apparatus of claim 14, further comprising means for decoding the representation of data using the modified at least one decode parameter, wherein the modified at least one decode parameter comprises one or more log likelihood ratio (LLR) values, one or more soft bit values, or a combination thereof.

16. The apparatus of claim 14, further comprising means for reading a second representation of data from the means for storing using the modified at least one read parameter, wherein the representation of data and the second representation of data correspond to the same location at the means for storing, and wherein the modified at least one read parameter comprises one or more read thresholds, one or more soft bit delta values, or a combination thereof.

17. A device comprising:
a memory; and
a controller coupled to the memory, wherein the controller is configured to determine an estimated memory error model associated with a representation of data stored in the memory based at least in part on the representation of data and reliability information associated with the representation of data, and wherein the controller is further configured to modify at least one read parameter used in a read operation at the memory or at least one decode parameter used in decoding the representation of data based on the estimated memory error model, wherein the controller is further configured to determine the estimated memory error model by computing a count of bits of the representation of data that have low estimated reliability and are estimated to be correct.

18. The device of claim 17, wherein the controller is configured to determine the estimated memory error model by computing at least two counts of bits of the representation of data that have different reliability information or by correlating the reliability information with a bitwise syndrome vector corresponding to the representation of data to determine the estimated memory error model.

19. The device of claim 17, wherein the controller is configured to determine the estimated memory error model based on joint statistics of syndrome information associated with the representation of data, the representation of data, and the reliability information.

20. The device of claim 19, wherein the estimated memory error model is associated with estimated counter values that more closely match the joint statistics than estimated counter values of other estimated memory error models, and wherein the controller is configured to determine the estimated memory error model based on a maximum likelihood analysis, a maximal a-posteriori probability analysis, or a minimum squared Euclidean distance between particular counts of bits of the representation of data and predicted counts of bits associated with the estimated memory error model.

\* \* \* \* \*